(12) United States Patent
Okuyama et al.

(10) Patent No.: US 7,030,421 B2
(45) Date of Patent: Apr. 18, 2006

(54) SEMICONDUCTOR LIGHT EMITTING DEVICE AND FABRICATION METHOD THEREOF

(75) Inventors: Hiroyuki Okuyama, Kanagawa (JP); Masato Doi, Kanagawa (JP); Goshi Biwa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/962,025

(22) Filed: Oct. 8, 2004

(65) Prior Publication Data

US 2005/0045894 A1   Mar. 3, 2005

Related U.S. Application Data

(63) Continuation of application No. 10/024,883, filed on Dec. 17, 2001, now Pat. No. 6,828,591.

(30) Foreign Application Priority Data

Dec. 15, 2000   (JP) .......................... P2000-381249

(51) Int. Cl.
*H01L 33/00* (2006.01)

(52) U.S. Cl. .................... 257/89; 257/95; 257/102; 257/103

(58) Field of Classification Search ................. 257/89, 257/95, 102, 103
See application file for complete search history.

(56) References Cited

U.S. PATENT DOCUMENTS

| 5,814,839 A | * | 9/1998 | Hosoba ..................... 257/96 |
| 5,905,275 A | * | 5/1999 | Nunoue et al. ............. 257/95 |
| 6,072,197 A | * | 6/2000 | Horino et al. .............. 257/103 |
| 6,635,901 B1 | * | 10/2003 | Sawaki et al. ............. 257/80 |

FOREIGN PATENT DOCUMENTS

| JP | 09-092881 | 4/1997 |
| JP | 09-162444 | 6/1997 |
| JP | 10-312971 | 11/1998 |

* cited by examiner

*Primary Examiner*—William M. Brewster
(74) *Attorney, Agent, or Firm*—Bell, Boyd & Lloyd LLC

(57) ABSTRACT

Semiconductor light emitting devices and methods of producing same are provided. The semiconductor light emitting devices include a substrate that has a surface including a difference-in-height portion composed of, for example, a wurtzite compound. A crystal growth layer is formed in the substrate surface wherein at least a portion of which is oriented along an inclined plane with respect to a principal plane of the substrate. The semiconductor device includes a first conductive layer, an active layer and a second conductive layer formed on the crystal layer in a stacked arrangement and oriented along the inclined place.

29 Claims, 11 Drawing Sheets

FIG. 3
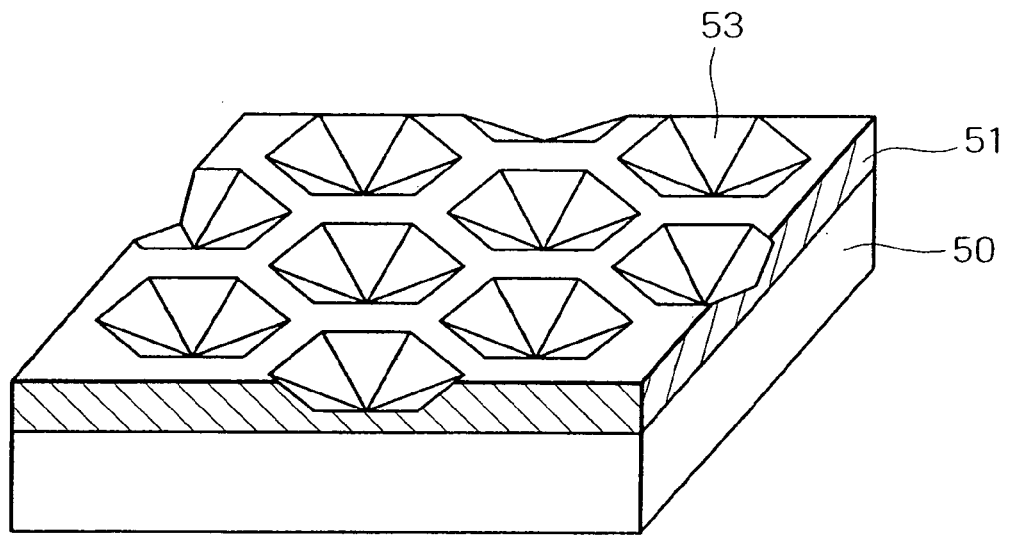
FIG. 4A
FIG. 4B
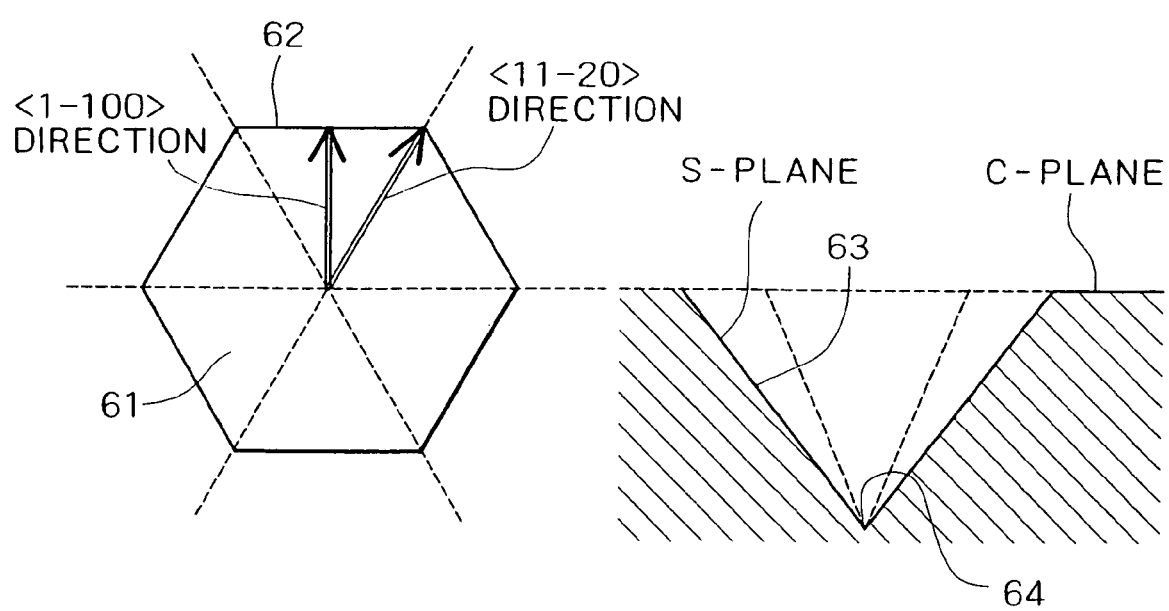

SEMICONDUCTOR LIGHT EMITTING DEVICE AND FABRICATION METHOD THEREOF

CROSS REFERENCE TO RELATED APPLICATIONS

The present application claims priority to Japanese Patent Document No. P2000-381249 filed on Dec. 15, 2000 herein incorporated by reference to the extent permitted by law. The present application is a continuation application of U.S. patent application Ser. No. 10/024,883 filed on Dec. 17, 2001, now U.S. Pat. No. 6,828,591 the disclosure of which is herein incorporated by reference.

BACKGROUND OF THE INVENTION

The present invention generally relates to semiconductor devices. More specifically, the present invention relates to semiconductor light-emitting devices and processes for producing same.

It is known that semiconductor light emitting devices can be fabricated by forming a low temperature buffer layer overall on a sapphire substrate, forming an n-side contact layer made from GaN doped with Si thereon, and stacking an n-side cladding layer made from GaN doped with Si, an active layer made from InGaN doped with Si, a p-side cladding layer made from AlGaN doped with Mg, and a p-side contact layer made from GaN doped with Mg thereon. As commercial products of semiconductor light emitting devices having such a structure, light emitting diodes and semiconductor lasers for emitting light of blue and green having a wavelength of 450 nm to 530 nm have been fabricated on a large scale.

With respect to growing gallium nitride (GaN), a sapphire substrate has been often used; however, in this case, dislocations may be contained in the grown crystal at a high density because of mismatching in lattice between the sapphire substrate and the gallium nitride to be grown thereon. From this viewpoint, a technique for forming a low temperature buffer layer on a substrate is effective to suppress defects caused in the crystal to be grown on the substrate. Further, a method of reducing crystal defects by usual epitaxial growth in combination with epitaxial lateral overgrowth (ELO) has been disclosed in Japanese Patent Laid-open No. Hei 10-312971.

Japanese Patent Laid-open No. Hei 10-312971 regarding a method of fabricating a semiconductor light emitting device describes that through-dislocations propagated in the direction perpendicular to a substrate principal plane is deflected in the lateral direction by a facet structure formed in a growth region during fabrication of the device, so that it is possible to block the propagation of the through-dislocation and hence to reduce crystal defects.

A light emitting system including a plurality of semiconductor light emitting devices in the form of light emitting diodes or semiconductor lasers is usable for an image display unit by using, as each of pixels arrayed in a matrix, a combination of light emitting diodes or semiconductor lasers of blue, green, and red, and independently driving the pixels; and is also usable for a white light emitting unit or an illumination unit by making the light emitting devices of blue, green, and red simultaneously emit light of blue, green, and red. In particular, since a light emitting device using a nitride semiconductor has a band gap energy ranging from about 1.9 eV to about 6.2 eV, it can realize a full-color display only by using one material. For this reason, a multi-color light emitting device using a nitride semiconductor has been actively studied. It is to be noted that the term "nitride" used herein means a compound which contains one or more of B, Al, Ga, In, and Ta as group III elements and N as a group V element, and which may contain impurities in an amount of 1% or less of the total amount or $1 \times 10^{20}$ cm$^3$ or less.

A technique of forming a multi-color light emitting device on the same substrate has been known, wherein a plurality of regions for emitting light of respective colors, which include active layers having different band gap energies corresponding to different emission wavelengths, are stacked, and a common electrode on the substrate side is provided while electrodes on the other side are individually provided on the light emission regions. In another known multi-color light emitting device, the regions for emitting light of respective colors are stepwise formed on the substrate for easy extraction of electrodes therefrom. The multi-color light emitting device of this type in which a plurality of layers including a pn-junction are stacked has a possibility that the light emission regions in the same device act just as a thyristor, and to prevent such operation similar to that of a thyristor, a multi-color light emitting device, in which grooves are formed between one and another of the stepwise light emission regions for isolating the light emission regions from each other, has been disclosed, for example, in Japanese Patent Laid-open No. Hei 9-162444.

Further, a light emitting device disclosed in Japanese Patent Laid-open No. Hei 9-92881 is configured such that, to realize multi-color light emission, an InGaN layer is formed on an alumina substrate via an AlN buffer layer, wherein a portion of the InGaN layer is doped with Al to form a blue light emission region, another portion of the InGaN layer is doped with P to form a red light emission region, and a non-doped portion of the InGaN layer is taken as a green light emission region.

The above-described techniques, however, have the following problems. Known epitaxial lateral overgrowth techniques and known crystal growth methods characterized by forming a facet structure in a growth region are advantageous in that since the propagation of through-dislocations can be deflected by a facet structure portion or the like, crystal defects can be significantly reduced. However, to form a light emission region including an active layer after epitaxial lateral overgrowth or formation of the facet structure, the epitaxial lateral overgrowth is further performed or the facet structure is buried so as to obtain a flat plane on which the light emission region is to be formed, with a result that the number of processing steps is increased and a time required for fabricating the device is prolonged.

Known multi-color light emitting devices are disadvantageous in that since the processing steps become complicated, it fails to form the light emitting device at a high accuracy, and since the crystallinity is degraded, it fails to provide good light emission characteristic. For the multi-color light emitting device in which grooves are formed between one and another of the stepwise light emission regions for isolating the light emission regions from each other, anisotropic etching must be repeated by several times for isolating the light emission regions including active layers from each other. This causes problems that since the crystallinity of each of the substrate and the semiconductor layer may be degraded by dry etching, it is difficult to sustain desirable crystallinity, and that since etching is repeated by several times, the number of steps required for mask alignment and etching is increased.

For the multi-color light emitting device in which impurities are selectively doped in the single active layer formed on the substrate, since a margin must be provided for forming an opening portion in the mask layer, a sufficient distance must be set between one and another of the different light emission regions, particularly, in the case of previously estimating a fabrication error, so that it is difficult to form a micro-side light emitting device, and further, the number of steps is increased by selective doping.

SUMMARY OF THE INVENTION

An advantage of the present invention is to provide a semiconductor light emitting device capable of reducing occurrence of crystal defects such as through-dislocations without increasing the number of fabrication steps and to provide a method of fabricating the semiconductor light emitting device.

Another advantage of the present invention is to provide a semiconductor light emitting device including light emission regions having different emission wavelengths, which is allowed to be fabricated at a high accuracy with a reduced number of steps and which is excellent in crystallinity, and to provide a method of fabricating the semiconductor light emitting device.

In an embodiment of the present invention, there is provided a semiconductor light emitting device including: a first conductive cladding layer, an active layer, and a second cladding layer; wherein a difference-in-height portion is formed in a surface of a wurtzite-type compound semiconductor layer; a crystal growth layer having an inclined plane is formed by crystal growth on the surface, having the difference-in-height portion, of the compound semiconductor layer; and the first conductive cladding layer, the active layer, and the second conductive layer are sequentially formed on the crystal growth layer in such a manner as to be approximately in parallel to the inclined plane of the crystal growth layer.

In an embodiment of the present invention, there is provided a method of fabricating a semiconductor light emitting device, including the steps of: forming a wurtzite-type compound semiconductor layer on a substrate principal plane in such a manner that a difference-in-height portion is formed in a surface of the compound semiconductor; forming a crystal growth layer having an inclined plane inclined with respect to the substrate principal plane by crystal growth on the surface, having the difference-in-height portion, of the compound semiconductor layer; and stacking a first conductive cladding layer, an active layer, and a second conductive layer in a region extending in parallel to the inclined plane.

With these configurations of the semiconductor light emitting device and the method of fabricating the semiconductor light emitting device according to the present invention, since a wurtzite type compound semiconductor layer having a difference-in-height portion is formed on a substrate principal plane, a crystal growth layer having a facet structure can be formed by making use of a difference in crystal growth rate between crystal growth directions at the difference-in-height portion. Since such a facet structure has an inclined plane inclined with respect to the substrate principal plane, it is possible to sufficiently reduce occurrence of crystal defects such as through-dislocations at the inclined plane. The stacked structure of a first conductive cladding layer, an active layer, and a second conductive cladding layer functions as a light emission region by injecting a current thereto. In particular, according to the present invention, since the inclined plane inclined with respect to the substrate principal plane is utilized while being left as not buried, it is possible to reduce occurrence of dislocations, and to facilitate the fabrication process because of elimination of the need of burying the inclined plane.

To achieve the second object, according to a third aspect of the present invention, there is provided a semiconductor light emitting device including: a first conductive cladding layer, an active layer, and a second active cladding layer; wherein a wurtzite-type compound semiconductor layer is formed on a substrate principal plane in such a manner that a difference-in-height portion is formed in a surface of the compound semiconductor; a crystal growth layer having an inclined plane inclined with respect to the substrate principal plane is formed by crystal growth on the surface, having the difference-in-height portion, of the compound semiconductor layer; the first conductive cladding layer, the active layer, and the second conductive layer are sequentially formed on two or more crystal planes including the inclined plane of the crystal growth layer, to form light emission regions; and electrodes are independently formed in the light emission regions formed on the two or more crystal planes.

With this configuration of the semiconductor light emitting device according to the present invention, a first conductive cladding layer, an active layer, and a second conductive layer are sequentially formed on two or more crystal planes including an inclined plane of a crystal growth layer, to form light emission regions; and electrodes are independently formed in the light emission regions formed on the two or more crystal planes. Since the independent electrodes are formed, the light emission regions are independently operated by supplying separate signals to the independent electrodes. As a result, light can be independently emitted from the two light emission regions of one device, and since light having different wavelengths can be emitted from the light emission regions of one device, the device can be used as a multi-color light emitting device.

Additional features and advantages of the present invention are described in, and will be apparent from, the following Detailed Description of the Invention and the Figures.

BRIEF DESCRIPTION OF THE FIGURES

FIG. 1A illustrates the step of forming a GaN layer doped with Si. FIG. 1B shows the step of forming a mask layer. FIG. 1C shows the step of forming difference-in-height portions. FIG. 1D shows the step of forming facet structures each having inclined planes. FIG. 1E shows the step of forming a GaN layer doped with Mg. FIG. 1F shows the step of forming an n-side electrode. FIG. 1G shows the step of forming a p-side electrode.

FIG. 2A shows the step of forming a GaN layer doped with Si. FIG. 2B shows the step of forming a mask layer. FIG. 2C shows the step of forming difference-in-height portions. FIG. 2D shows the step of forming facet structures each having inclined planes. FIG. 2E shows the step of forming a GaN layer doped with Mg. FIG. 2F shows the step of forming an n-side electrode. FIG. 2G shows the step of forming a p-side electrode.

FIG. 3 is a perspective view showing a step of fabricating a semiconductor light emitting device according to an embodiment of the present invention, wherein a facet structure is shown in a development state that has a honeycomb-type inverse-hexagonal shape.

FIGS. 4A and 4B are views showing portions of the semiconductor light emitting device according to an embodiment of the present invention. FIG. 4A shows a planar shape of a difference-in-height portion. FIG. 4B shows a cross-sectional shape of a facet.

FIG. 5A shows the step of forming a silicon oxide layer. FIG. 5B shows the step of forming an opening portion in a resist layer. FIG. 5C shows the step of forming a window portion in the silicon oxide layer. FIG. 5D shows the step of forming an electrode by a lift-off process. FIG. 5E shows the step of removing the resist layer. FIG. 5F shows the step of forming an n-side electrode.

FIG. 6A shows the step of forming a silicon oxide layer. FIG. 6B shows the step of forming an opening portion in a resist layer. FIG. 6C shows the step of forming an electrode by a lift-off process. FIG. 6D shows the step of forming an n-side electrode.

DETAILED DESCRIPTION OF THE INVENTION

Figure 1A:
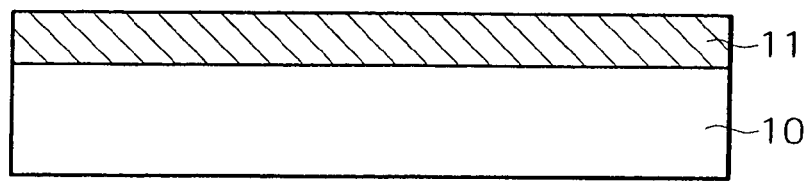
FIGS. 1A to 1G are sectional views showing steps of fabricating a semiconductor light emitting device according to an embodiment of the present invention.

The present invention relates to semiconductor devices. In particular, the present invention relates to semiconductor light emitting devices and methods of producing same.

In an embodiment, a semiconductor light emitting device includes a wurtzite-type compound semiconductor layer having in its surface a difference-in-height portion is formed on a principal plane of a substrate; a crystal growth layer including a facet structure having an inclined plane inclined with respect to the principal plane of the substrate wherein the crystal growth layer is formed by crystal growth on the surface, having the difference-in-height portion, of the compound semiconductor layer; and a first conductive cladding layer, an active layer, and a second conductive cladding layer are formed in a region extending in parallel to the inclined plane.

It should be appreciated that any suitable type of material or materials can be utilized to fabricate the semiconductor light emitting device of the present invention to the extent that a wurtzite-type compound semiconductor layer can be formed on the substrate. For example, the substrate may be made from a sapphire (Al2O3, whose desirable crystal plane is an A-plane, R-plane, or C-plane), SiC (having a structure of 6H, 4H or 3C), GaN, Si, ZnS, ZnO, AlN, LiMgO, LiGaO2, GaAs, MgAl2O4, InAlGaN-like or combination thereof. The substrate can be formed into any suitable shape or configuration. In an embodiment, the substitute material includes a hexagonal system, cubic system or the like, preferably a hexagonal system. For example, in the case of growing a gallium nitride (GaN) based compound semiconductor on a substrate, it may be desirable that the substrate be made from sapphire with its C-plane taken as a principal plane of the substrate. It is to be noted that the crystal plane of sapphire used for the substrate principal plane is not strictly limited to the C-plane but may be substantially equivalent to the C-plane. For example, the substrate principal plane may be positioned relative to the C-plane at an angle ranging from about 5° to about 6°.

A compound semiconductor layer to be formed on the substrate principal plane may be made from a nitride semiconductor having a wurtzite-type crystal structure, a BeMgZnCdS based semiconductor layer, a BeMgZnCdO based compound semiconductor layer or the like because a facet structure will be formed thereon in the subsequent step.

As the above nitride semiconductor having a wurtzite-type crystal structure, there may be used a group III based compound semiconductor, for example, a gallium nitride (GaN) based compound semiconductor, an aluminum nitride (AlN) based compound semiconductor, an indium nitride (InN) based compound semiconductor, an indium gallium nitride (InGaN) based compound semiconductor aluminum gallium nitride (AlGaN) based compound semiconductor or the like. In particular, a gallium nitride based compound semiconductor is preferably used as the material for forming the nitride semiconductor layer to be formed on the substrate. It is to be noted that a nitride semiconductor such as InGaN, AlGaN, or GaN is not necessarily composed of only a ternary or binary mixed structure. For example, an InGaN semiconductor may contain an impurity such as a trace of Al in a range not changing the function of InGaN. In this specification, the term "nitride" means a compound which contains one or more of B, Al, Ga, In, and Ta as the group III elements and N as the group V element, and which may contain impurities in an amount of 1% of the total amount or less or $1 \times 10^{20}$ cm$^3$ or less.

The compound semiconductor layer may be grown on the substrate by one of various vapor phase growth processes, for example, a metal organic chemical deposition (MOCVD), metal organic vapor phase epitaxial growth (MOVPE) process, a molecular beam epitaxial growth (MBE) process, a hydride vapor phase epitaxial growth (HVPE) process or the like. In an embodiment, the MOVPE process is preferred as it is capable of growing the compound semiconductor layer with a high crystallinity on the substrate at a high processing rate. In the MOVPE process, typically, an alkyl metal compound is used as each of Ga, Al and In sources, for example, TMG (trimethyl gallium), TEG (triethyl gallium), or the like, is used as the Ga source, TMA (trimethyl aluminum), TEA (triethyl aluminum), or the like, is used as the Al source, and TMI (trimethyl indium), TEI (triethyl indium), or the like, is used as the In source. The MovPE process can also include a gas such as ammonia or hydradine as a nitrogen source; silane gas as an Si (impurity)

source, Cp2Mg (cyclopentadienyl magnesium) as a Mg (impurity) source, a DEZ (diethyl zinc) gas as a Zn (impurity) source or the like. According to the MOVPE process, for example, an InAlGaN based compound semiconductor layer can be grown on the substrate by supplying gases composed of In, Al, Ga and N sources and/or a gas as an impurity source to the front surface of the substrate heated, for example, at 600° C. or more, to decompose the source gases, thereby allowing epitaxial growth of an InAlGaN based compound semiconductor on the substrate.

In an embodiment, to form a facet structure having an inclined plane inclined with respect to the substrate principal plane by crystal growth, a difference-in-height portion is formed in a surface of the above-described compound semiconductor layer as an under layer for crystal growth. The difference-in-height portion functions to make, during crystal growth, a growth rate of a crystal plane perpendicular to a crystal plane appearing on the substrate. For example, the substrate principal plane different from a growth rate of a crystal plane parallel to the substrate principal plane, to thereby form a facet structure. In an embodiment, the difference-in-height portion is formed in the surface of the compound semiconductor layer by photolithography and anisotropic etching using a mask layer made from silicon oxide or silicon nitride. The shape of the difference-in-height portion is not particularly limited insofar as the difference-in-height portion allows formation of a facet structure having an inclined plane inclined with respect to the substrate principal plane. For example, the difference-in-height may be formed into a shape selected from a stripe shape, rectangular shape, a round shape, a polygonal shape such as a triangular shape or hexagonal shape, or the like. The shape of the difference-in-height portion means the planar shape of the difference-in-height portion. For example, according to an embodiment of the present invention, the difference-in-height portion having a triangular shape means not only the difference-in-height portion projecting into a triangular hole but also the difference-in-height portion recessed into a triangular shape. A plurality of different-in-height portions may be formed overall or partially on the surface of a compound semiconductor layer. In addition, different difference-in-height portions may be formed in combination.

After the difference-in-height portion is formed in the compound semiconductor layer, a crystal growth layer including a facet structure having an inclined plane is formed thereon by crystal growth in accordance with the same manner as that for forming the above-described compound semiconductor layer, for example, one of various vapor phase growth processes, such as the metal organic chemical deposition (MOCVD) or metal organic vapor phase epitaxial growth (MOVPE) process, the molecular beam epitaxial growth (MBE) process, or the hydride vapor phase epitaxial growth (HVPE) process. The crystal growth layer formed on the compound semiconductor layer having the difference-in-height portion is typically made from the same material as that for forming the compound semiconductor layer. The material for forming the crystal growth layer, however, may be made from another compound semiconductor material insofar as it can form a facet structure by crystal growth while being dependent on the shape of the difference-in-height portion.

As previously discussed, the crystal growth layer includes a facet structure having an inclined plane inclined with respect to a substrate principal plane by crystal growth. In an embodiment, the inclined plane includes an S-plane, a {11–22} plane, the like, or planes being substantially equivalent thereto. Here, the plane being substantially equivalent to the S-plane means a plane inclined with respect to the S-plane at an angle ranging from about 5° to about 6°. For example, if the C-plane is selected as the substrate principal plane, it is possible to form the S-plane and the plane being substantially equivalent thereto. The S-plane is a stable plane which can be selectively grown on the C+ plane. The S-plane is expressed by a (1–101) plane in Miller index for the hexagonal system. The C+ plane and C– plane are present as the C-plane, and similarly, the S+ plane and S– plane are present as the S-plane. According to the present invention, unless otherwise specified, the S+ plane, which is grown on the C+ plane of the GaN layer, is taken as the S-plane. In this regard, the S+ plane is more stable than the S– plane. In addition, the C+ plane is expressed by a (0001) plane in Miller index.

In the case of growing a gallium nitride based compound semiconductor for forming the above-described crystal growth layer, the number of bonds of gallium to nitride at the S-plane becomes two or three, which is the largest among crystal planes excluding the C– plane. Here, since the C– plane cannot be formed on the C+ plane, the number of bonds of gallium to nitride at the S-plane becomes largest among the crystal planes. For example, in the case of growing a wurtzite-type nitride on a sapphire substrate using the C+ plane as the principal plane, the surface of the nitride generally becomes the C+ plane; however, the S-plane can be stably formed by making use of selective growth. At a plane parallel to the C+ plane, nitrogen liable to be eliminated is bonded to gallium via a single bond. On the other hand, at an inclined S-plane, nitrogen is bonded to gallium via at least one or more bonds. In this regard, at the S-plane, a V/III ratio is effectively increased, to improve the crystallinity of the crystal growth layer. Further, in the case of forming the crystal growth layer, it is grown along the direction different from the orientation of the C+ plane of the substrate. In this regard, since dislocations propagated upwardly from the substrate are deflected, it is possible to reduce occurrence of crystal defects.

It should be appreciated that the type of an inclined plane of a facet structure formed on the crystal growth layer is controlled, for example, on the basis of a growth condition at the time of crystal growth, and shapes of a difference-in-height portion and a mask portion. For example, in the case where a difference-in-height portion extending in a stripe shape is formed in a surface of a gallium nitride-based semiconductor layer where the longitudinal direction of the stripe is a <11–20> direction, a facet structure having the S-plane as an inclined plane is formed. In this case, the facet structure is formed into an inverse V-shape in a cross-sectional view taken along a plane perpendicular to the longitudinal direction of the stripe. Since the shape of the difference-in-height portion is not limited to the stripe shape, the cross-section of the crystal growth layer can have any other shape than the stripe shape, for example, a rectangular shape, a round shape, a triangular shape, a hexagonal shape, or the like. The crystal growth layer is grown depending on the shape of the difference-in-height portion. If the extending direction of an end portion of the difference-in-height portion is set to be approximately perpendicular to a <1–100> direction or the <11–20> direction, then a difference in growth rate between growth in the lateral direction and growth in the vertical direction appears necessarily results in a facet structure. In an embodiment, crystal growth temperature at the time of growth of the crystal growth layer is about 1100° C. or less. If the crystal growth temperature is higher than 1100° C., there occurs an inconvenience that characteristics (particularly, optical characteristic) of the crystal is degraded. In an embodiment, a pressure at the time of growth of the crystal growth layer is about 100 Torr or more. If the pressure is less than 100 Torr, there occurs an inconvenience that the growth condition is varied, so that a desired crystal plane cannot be obtained and a conductivity of the crystal growth layer becomes poor.

In one embodiment, the semiconductor device of the present invention includes a first conductive cladding layer, an active layer, and a second conductive cladding layer stacked on the crystal growth layer having the facet structure in a region extending in parallel to the inclined plane of the facet structure. In an embodiment, a crystal growth temperature at the time of growth of an InGaN active layer is set in a range of about 700° C. to about 800° C. At such a crystal growth temperature, since a decomposition efficiency of ammonia is low, the amount of an N source must be increased. As a result of observing a facet structure grown on a crystal growth layer by using cathode luminescence in an experiment performed by the inventors, it was revealed that the S-plane taken as an inclined plane of the facet structure has a desirable crystallinity and exhibits a higher luminous efficiency as compared with the C+ plane. As a result of observation of the surface of the inclined plane by AFM, it was found that the surface was suitable for incorporation of InGaN.

It was also found that the growth of the S-plane allows the layer doped with Mg to be grown in a good surface state and makes a doping condition for the layer doped with Mg very different from a doping condition for the layer doped with Mg formed on the C+ plane. As a result of microscopic photoluminescence mapping, although the surface of the layer doped with Mg formed on the C+ plane by the usual manner has an unevenness of a pitch of about 1 µm, the surface of the layer doped with Mg formed on the S-plane obtained by selective growth was even and measured at a resolution of about 0.5 mm to about 1 µm. Further, as a result of observation by SEM, it was revealed that the flatness of the inclined plane, that is, the S-plane is superior to that of the C+ plane.

With respect to the first conductive cladding layer, the active layer, and the second conductive cladding layer, which are layered in a stacked arrangement in the region extending in parallel to the inclined plane, the conductive type of the first conductive cladding layer is a p-type or an n-type, and the conductive type of the second conductive cladding layer is the n-type or the p-type. For example, in the case where a crystal growth layer having the S-plane is made from a gallium nitride based compound semiconductor doped with silicon, a gallium nitride based compound layer doped with silicon may be formed as an n-type cladding layer on the compound semiconductor layer having the S-plane, an InGaN layer can be formed as an active layer thereon, and a gallium nitride based compound semiconductor layer doped with magnesium be formed as a p-type cladding layer thereon, to thus form a double hetero structure. The active layer may be of a structure in which an InGaN layer is held between AlGaN layers or an AlGaN layer is provided on one side of the InGaN layer. The active layer may be a single bulk active layer; however, it may be of a quantum well structure such as a single quantum well (SQW) structure, a double quantum well (DQW) structure, or a multi-quantum well (MQW) structure. In the case of adopting the quantum well structure, one or more barrier layers are used for separating quantum wells from each other.

The use of the InGaN layer as the active layer is advantageous in facilitating the fabricating process and enhancing an emission characteristic of the device. Another advantage of the use of the InGaN layer is that the InGaN layer can be easily crystallized on the S-plane, which has the structure from which nitrogen atoms are less eliminated, with a good crystallinity to enhance the emission efficiency. In addition, even in a state that a nitride semiconductor is not doped with an impurity, the conductive type of the nitride semiconductor becomes the n-type because of nitrogen holes generated in crystal; however, in general, an n-type nitride semiconductor having a desirable carrier concentration is obtained by doping a doner impurity such as Si, Ge, Se, or the like, in crystal. On the other hand, a p-type nitride semiconductor is obtained by doping an acceptor impurity such as Mg, Zn, C, Be, Ca, Ba, or the like, in crystal. In this case, to obtain a p-type nitride semiconductor having a high carrier concentration, the nitride semiconductor having been doped with an acceptor impurity may be annealed in an inert gas atmosphere such as nitrogen or argon, or activated by irradiation of electron beams, microwaves, or light. Such an active layer is desirable to be obtained by a semiconductor growth layer formed only one growth. Only one growth means growth by a single film formation treatment or a sequence of film formation treatments, and therefore, it does not mean repeated formation of a plurality of active layers.

As previously discussed, the first conductive cladding layer, the active layer, and the second conductive cladding layer extend within a plane parallel to an inclined plane. Such formation of the stacked structure within a plane parallel to an inclined plane can be easily performed by continuing crystal growth, after formation of the inclined plane. The first conductive cladding layer can be made from the same material having the same conductive type as that of the crystal layer having the S-plane, and accordingly, after the crystal layer having the S-plane is formed, the same material can be continuously grown by adjusting a concentration thereof. Alternatively, there may be adopted a structure that part of the crystal layer having the S-plane functions as the first conductive cladding layer.

According to the semiconductor light emitting device of the present invention, inventors have discussed that the luminous efficiency can be enhanced by making use of a good crystallinity of an inclined plane formed by crystal growth. In particular, when a current is injected only in the S-plane having a good crystallinity, the luminous efficiency can be made higher because the S-plane has a high In capture characteristic and a good crystallinity. In this regard, to fabricate a multi-color light emitting device by using an InGaN layer, it is desirable that In can be sufficiently captured as crystal, and the luminous efficiency of the device can be enhanced by making use of a good crystallinity of the S-plane. In the case of crystal growth on the C+ plane, gallium has only one bond to nitrogen liable to be eliminated, and accordingly, when crystal growth is performed by using ammonia whose decomposition efficiency is low, it is impossible to increase an effective V/III ratio, with a result that it fails to obtain good crystal growth. In the case of crystal growth on the S-plane, since the number of bonds of gallium to nitrogen at the S-plane is as large as two or three, the elimination of nitrogen becomes small and thereby the effective V/III ratio becomes high. In general, the quality of crystal grown on not only the S-plane but also any plane other than the C+ plane becomes high because the number of bonds of gallium to nitrogen tends to be increased for growth on any crystal growth plane other than the C+ plane. The growth of crystal on the S-plane is also advantageous in that the amount of In incorporated in the crystal grown on the S-plane becomes high. The increased amount of In incorporated in crystal grown on the S-plane is effective for fabricating a multi-color light emitting device because a band gap energy is determined on the base of the amount of In incorporated in crystal.

In an embodiment of the semiconductor light emitting device of the present invention, two or three light emission regions having two or three kinds of emission wavelengths can be formed on the same device. These light emission regions are formed on two or more crystal planes including an inclined plane of a crystal growth layer. In the case where the substrate principal plane is the C-plane and the inclined plane is the S-plane, one of the light emission regions is formed in a region parallel to the S-plane, and another light emission region can be formed in a region of a crystal growth plane corresponding to the C-plane. The emission wavelength of one light emission region can be made different from that of another light emission region by making at least one of a composition and a thickness of an active layer between the two light emission regions, that is, making only the composition of the active layer, only the thickness of the active layer, or both the composition and the thickness of the active layer different between the two light emission regions.

The composition of an active layer can be adjusted by changing a mixing ratio of elements of a ternary or binary mixed crystal constituting the active layer. In the case of using an InGaN layer as the active layer, a semiconductor light emitting device for emitting light of a long-wavelength can be obtained by increasing the amount of In contained in the active layer. In crystal growth of an InGaN layer of an embodiment, a migration length of InGaN, particularly with respect to In, is estimated about 1 µm to about 2 µm at about 700° C. for optimum crystal growth of the InGaN layer having a relatively large amount of In. This is because InGaN precipitated on a mask is grown from a selective growth portion only by about 1 µm to about 2 µm. The migration length of In may be thus regarded as about 1 µm to about 2 µm. Since the migration length of In contained in InGaN in a region from the mask portion of the growth portion is relatively short, that is, about 1 µm to about 2 µm, the content of In or the thickness of InGaN may differ in such a region.

The wavelength of light emerged from an active layer is liable to be changed depending on from which location of the active layer the light is emerged. This is because the migration length of In is shorten at about 700° C. optimum for crystal growth of the InGaN layer having a relatively large amount of In. According to the semiconductor light emitting device of the present invention, by making effective use of the fact that the emission wavelength differs between one and another of regions within the same active layer, first and second light emission regions having different emission wavelengths are formed in the same active layer, and currents are injected in the first and second light emission regions, respectively. Independent electrodes are formed in the first and second light emission regions for independently injecting currents therein. In this case, the electrodes on one side (p-side or n-side) in the first and second light emission regions can be utilized. According to an embodiment of the present invention, a multi-color semiconductor light emitting device can be obtained by forming two or more light emission regions having different emission wavelengths in the same active layer, and independently injecting current therein, and further, a semiconductor light emitting device for emitting light of a mixed color or white light can be obtained by forming two or more light emission regions having different emission wavelengths in the same active layer, and controlling the device such that the light emission regions simultaneously emit light.

In a crystal layer formed on a facet structure having an inclined plane, an effective V/III ratio is determined by a complicated combination of a location, orientation of a crystal plane, and the like. The growth of the facet is also dependent on growth conditions such as a growth temperature. From experimental data obtained by examining cathode luminescence of a double hetero structure produced by selective growth in accordance with an embodiment of the present invention, it was revealed that the emission wavelength of an upper portion of the double hetero structure is longer than that of a lower portion of the double hetero structure by about 100 (nanometers) nm. These experimental data showed that, by providing different electrodes at different locations of the double hetero structure, two or more light emission regions having different emission wavelengths can be provided with respect to a single crystal growth, and therefore, a semiconductor light emitting device for emitting light of multi-colors or emitting white light can be fabricated via a single crystal growth.

For example, in the case of forming a stripe shaped difference-in-height portion and forming a facet structure having an inclined plane composed of the S-plane obtained by crystal growth and the C-plane, a light emission region formed on the inclined plane is taken as a long-wavelength light emission region and a light emission region formed on the C-plane is taken as a short-wavelength light emission region. This may be reversed depending on the crystal growth conditions. Also, since the incorporated amount of In differs depending on a distance from a substrate, an emission wavelength in a higher light emission region parallel to the C-plane becomes different from an emission wavelength in a lower light emission region parallel to the C-plane. As a result, it is possible to provide a first light emission region on the S-plane, a second light emission region on a higher plane parallel to the C-plane, and a third light emission region on a lower plane parallel to the C-plane.

Electrodes for independently injecting currents in such light emission regions having different emission wavelengths are individually formed in these light emission regions. In this case, the electrodes on one side (p-side or n-side) can be utilized. To lower a contact resistance, a contact layer may be formed, and then an electrode be formed thereon. In general, each electrode is obtained by forming a multi-layer metal film by vapor-deposition. Such a multi-layer metal film may be finely divided into electrodes for respective light emission regions by photolithography and lift-off, or the like. Each electrode may be formed on a selective crystal growth layer or one surface of a substrate; however, to realize electrode wiring at a high density, electrodes may be provided on both the sides. Electrodes provided in different regions and independently driven may be formed from the same electrode material by photolithography and lift-off, or the like; however, they may be made from different and suitable electrode materials. A thickness of a resist layer used for lift-off is preferably in a range of about 1 µm or more. If the thickness of the resist layer is less than about 1 µm, it is difficult to smoothly perform the lift-off and hence to effectively remove the useless metal film.

Currents may be independently injected in respective light emission regions having different emission wavelengths. In an embodiment, the semiconductor light emitting device of the present invention, which can include a structure including a plurality of emission regions for emitting light of RGB (red (R), green (G), blue (B)) or CYM (cyan (C), yellow (Y), magenta (M)), is applicable for a color image display such as a full color display. Further, the semiconductor light emitting device of the present invention in accordance with an embodiment which has a structure including a plurality of light emission regions for emitting light of three primary colors or two or more colors, is applicable for an illuminating unit, or the like, for emitting light of a mixed color or white light by injecting the same current in the plurality of light emission regions.

By way of example, and not limitation, the following examples illustrate a variety of semiconductor light emitting devices in accordance with an embodiment of the present invention.

EXAMPLE ONE

A semiconductor light emitting device is fabricated by forming a plurality of stripe shaped difference-in-height portions on a sapphire substrate, and forming a crystal growth layer having facet structures each having inclined planes by making use of the stripe shaped difference-in-height portions. A method of fabricating the semiconductor light emitting device and a device structure thereof according to an embodiment will be described with reference to FIGS. 1A to 1G.

As shown in FIG. 1A, a GaN layer 11 doped with silicon is formed at about 1000° C. on a principal plane (C+ plane) of a sapphire substrate 10. In addition, a low temperature buffer layer (not shown) made from AlN or GaN is often formed at a low temperature of about 500° C. between the sapphire substrate 10 and the GaN layer 11. It should be appreciated that the layers of the semiconductor device of the present invention can be grown under any suitable operating conditions, such as pressures varying from about 200 Torr or more, including about 740 Torr or at about standard or normal pressures.

Figure 1B:
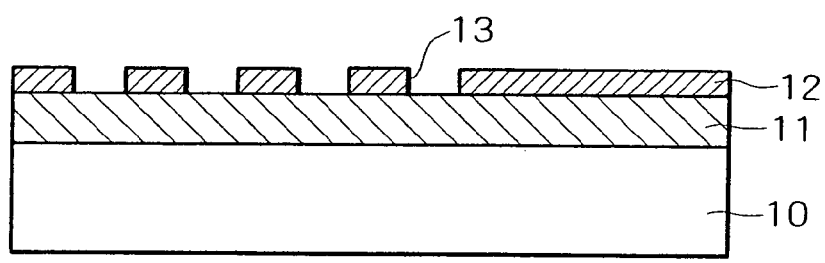

As shown in FIG. 1B, a mask layer 12 made from SiO2 or SiN is formed overall on the GaN layer 11 doped with silicon to a thickness of about 100 nm to about 500 nm. The mask layer 12 is patterned, by photolithography and etching using a photoresist layer, into a pattern having stripe shaped opening portions 13 spaced parallel from each other with a specific pitch. The depth of each opening portion 13 is set such that the opening portion 13 reaches the GaN layer 11. For example, each stripe shaped opening portion 13 extends in the <11–20> or <1–100> direction, and a width of the opening portion 13 is in a range of about 0.1 μm to about 10 μm. After the opening portions 13 are formed in the mask layer 12, the resist layer is removed. In this state, the GaN layer 11 is exposed within the opening portions 13 formed in the mask layer 12.

Figure 1C:
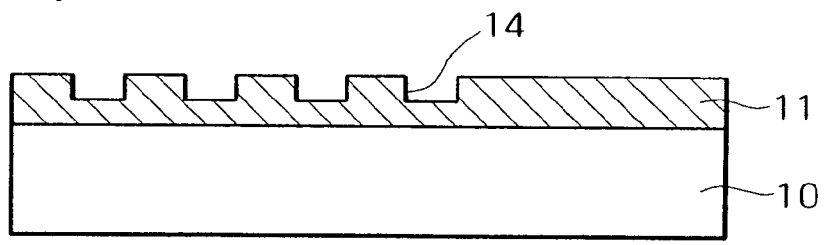

A surface of the GaN layer 11 is selectively etched by using the mask layer 12 as a mask, so that the surface of the GaN layer 11 is selectively cut off in a pattern depending on the pattern of the stripe shaped opening portions 13, to form stripe shaped difference-in-height portions 14. The difference-in-height portion 14 has a high-level portion which is located directly under a mask portion of the mask layer 12 and is thereby not etched, and a low-level portion which is located under the opening portion 13 and is thereby etched. In a plan view, the stripe pattern of the difference-in-height portions 14 corresponds to the stripe pattern of the opening portions 13 of the mask layer 12. After the difference-in-height portions 14 are formed, the mask layer 12 is removed by hydrofluoric acid or the like. Such a state is shown in FIG. 1C.

Figure 1D:
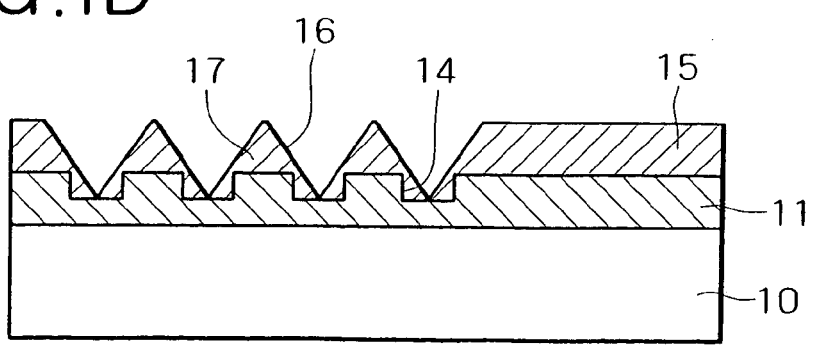

As shown in FIG. 1D, GaN doped with Si is grown on the surface, having the difference-in-height portions 14, of the GaN layer 11 by epitaxial growth, to form a crystal growth layer 15 including facet structures 17 each having inclined planes. The epitaxial growth may be performed, after the substrate temperature is raised, in accordance with a vapor phase epitaxial (VPE) process, an organic metal chemical vapor deposition (MOCVD), or the like. At the time of crystal growth, there appears a facet structure having inclined planes with elapsed time due to a difference in crystal growth rate between different planes of each difference-in-height portion 14. Such an inclined plane is designated by reference numeral 16 in FIG. 1D, which may be typically an S-plane, that is, the {1–101} plane, or {11–22} plane. Depending on the shape of the stripe shaped difference-in-height portion 14, a pair of the inclined planes 16 are opposed to each other at the low-level portion, that is, the valley of the difference-in-height portion 14. That is to say, each facet structure, designated by reference numeral 17, is configured as a projecting rib which is formed into an approximately inverse-V shape in cross-section and which extends along the longitudinal direction of the stripe shape of the difference-in-height portion 14.

Figure 1E:
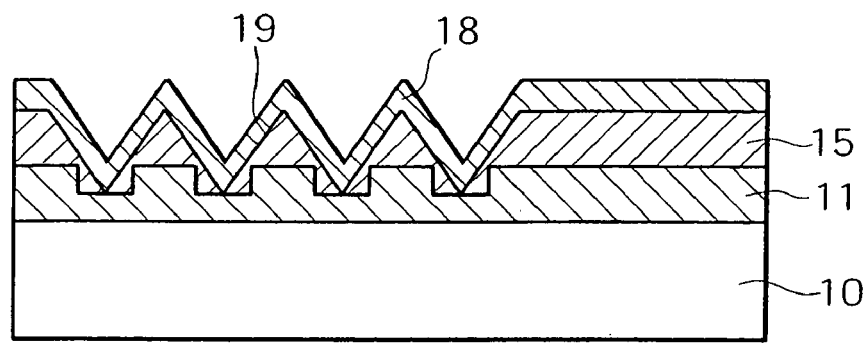

As shown in FIG. 1E, after the crystal growth layer 15 including the facet structures 17 each having the inclined planes 16 is formed, a GaN layer doped with Si is formed on the crystal growth layer 15, an InGaN layer is formed thereon under a condition that the growth temperature is lowered, and a GaN layer 18 doped with Mg is formed thereon. The GaN layer doped with Si functions as a first conductive cladding layer, the InGaN layer functions as an active layer, and the GaN layer 18 doped with Mg functions as a second conductive cladding layer. It is to be noted that the GaN layer doped with Si and the InGaN layer, which are formed under the GaN layer 18 doped with Mg, are depicted by a line 19. These layers forming a light emission region, which are formed on the facet structures 17 each having the inclined planes 16, extend in parallel to the inclined planes 16. A thickness of the InGaN layer may be in a range of about 0.5 nm to about 10 nm, preferably, about 1 nm to about 3 nm. The InGaN layer may be replaced with a quantum well structure having an (Al)GaN/InGaN structure, a multi-quantum well structure, a multi-structure using a GaN layer or an InGaN layer as a guide layer or other suitable structure. At this time, an AlGaN layer may be grown on the InGaN layer. In this regard, since the active layer and the cladding layers are directly formed on the facet structures 17 each having the inclined planes 16, it is possible to eliminate the need of provision of a step of burying the facet structures each having the inclined planes with the GaN layer. Also in the case of using the S-planes as the inclined planes, since the number of bonds of gallium to nitrogen at the S-plane becomes larger than that at any other crystal plane, it is possible to enhance the quality of crystal.

Figure 1F:
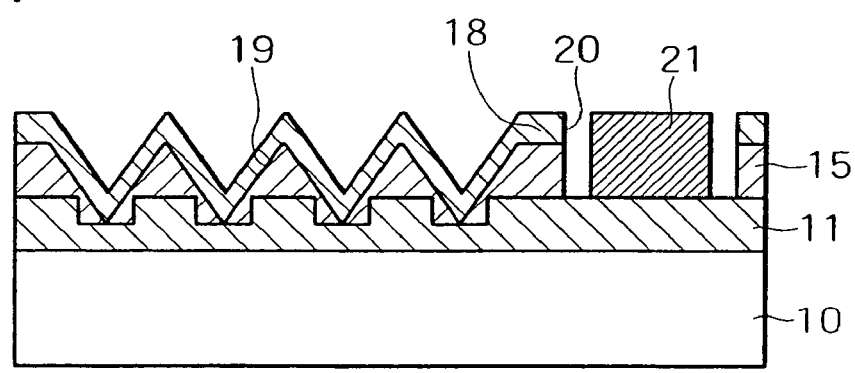

As shown in FIG. 1F, part of the stacked layers are removed, to form an opening portion 20 reaching the GaN layer 11. A Ti/Al/Pt/Au electrode is formed by vapor deposition on a portion, exposed within the opening portion 20, of the GaN layer 11. The Ti/Al/Pt/Au electrode is taken as an n-side electrode 21 as shown in FIG. 1F.

Figure 1G:
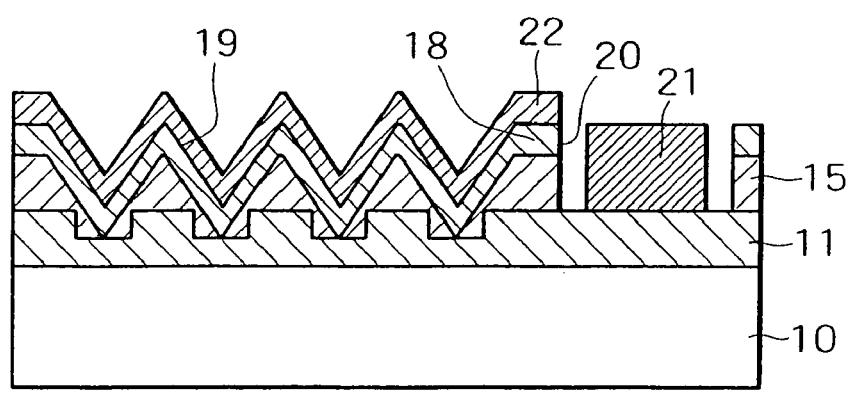

After the n-side electrode 21 is formed, an Ni/Pt/Au electrode or Ni(Pd)/Pt/Au electrode is formed by vapor deposition on the uppermost one of the stacked layers, that is, the GaN layer 18 doped with Mg. The Ni/Pt/Au electrode or Ni(Pd)/Pt/Au electrode is taken as a p-side electrode 22 as shown in FIG. 1G. In addition, if a transparent electrode is formed as the p-side electrode, light can be emerged from an upper surface side of the device, and if the thickness of the p-side electrode is large, light can be emerged from a lower surface side of the device.

The semiconductor light emitting device thus fabricated has a structure shown in FIG. 1G. As described above, the GaN layer 11 doped with silicon is formed on the sapphire substrate 10 with the C+ plane of sapphire taken as the substrate principal plane; the facet structures 17 each having the inclined planes 16 which are inclined with respect to the C+ plane by making use of the difference-in-height portions 14 formed in the surface of the GaN layer 11; and the GaN layer doped with Si, the InGaN layer, and the GaN layer 18 doped with Mg are formed in such a manner as to extend on the planes parallel to the inclined planes 16. In this structure, the InGaN layer held between the two GaN layers is taken as the active layer for emitting light. When a current is supplied to the active layer between the p-side electrode 22 connected to the GaN layer 18 doped with Mg and the n-side electrode 21 connected to the GaN layer 11 doped with Si, there occurs light emission of the semiconductor light emitting device having the above structure.

In the semiconductor light emitting device having the above structure, the facet structures 17 each having the inclined planes 16 are formed before the active layer is formed, and consequently, even if through-dislocations are propagated from the substrate, the propagation of the through-dislocations is deflected by the inclined planes 16, with a result that it is possible to suppress occurrence of crystal defects. In this regard, since it is not required to bury the facet structures 17 each having the inclined planes 16 with the GaN layer, it is possible to reduce the number of steps and to relatively shorten a time required for fabricating the light emitting device. Further, since the cladding layers and the active layer are formed by making use of the inclined planes 16 which are inclined or diagonally oriented with respect to the substrate principal plane, it is possible to form a light emission region with good crystallinity because the number of bonds of gallium to nitrogen becomes larger at each inclined plane 16.

It should be appreciated that the semiconductor devices of the present invention can be applied in a variety of different and suitable applications. For example, the semiconductor light emitting device can be used not only as a light emitting diode but also as a semiconductor laser by forming a resonance end face at an end portion of the device, and further, it can be used as a light emitting diode or semiconductor laser of multi-colors by forming electrodes in two or more light emission regions different from each other in terms of emission wavelength as will be described.

EXAMPLE TWO

In Example Two, a semiconductor light emitting device is fabricated in the same manner as that for fabricating the semiconductor light emitting device Example One except for formation of a facet structure.

Figure 2A:
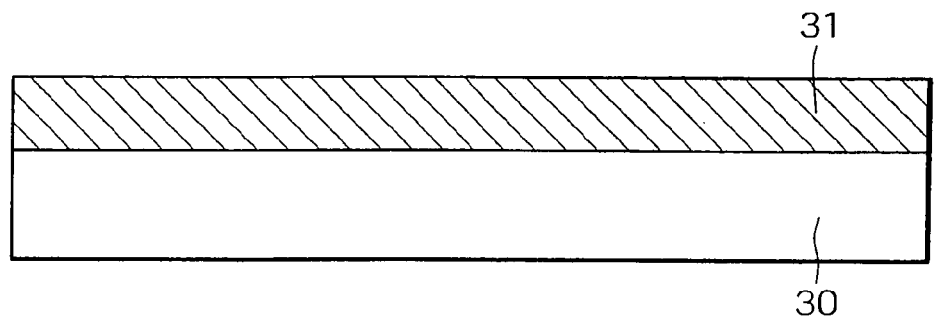
FIGS. 2A to 2G are sectional views showing steps of fabricating a semiconductor light emitting device according to an embodiment of the present invention.

As shown in FIG. 2A, a GaN layer 31 doped with silicon is formed at about 1000° C. on a principal plane (C+ plane) of a sapphire substrate 30. In addition, a low temperature buffer layer (not shown) made from AlN or GaN can be formed at a low temperature of about 500° C. between the sapphire substrate 10 and the GaN layer 31. It is to be noted that, in the fabrication process according to an embodiment, growth of respective layers are grown substantially at about normal or standard pressures, for example, about 740 Torr.

Figure 2B:
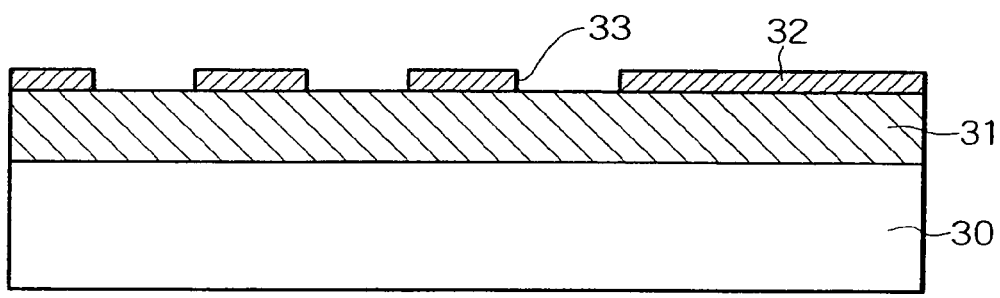

As shown in FIG. 2B, a mask layer 32 made from SiO2 or SiN is formed overall on the GaN layer 31 doped with silicon to a thickness of about 100 nm to about 500 nm. The mask layer 12 is patterned, by photolithography and etching using a photoresist layer, into a pattern having stripe shaped opening portions 33 spaced parallel from each other with a specific pitch. The depth of each opening portion 13 is set such that the opening portion 33 reaches the surface of the GaN layer 31. For example, each stripe shaped opening portion 33 extends in the <11–20> or <1–100> direction, and a width of the opening portion 33 is in a range of about 0.1 µm to about 10 µm. After the opening portions 33 are formed in the mask layer 32, similar to Example One, the resist layer is removed. In this state, the GaN layer 31 is exposed within the opening portions 33 formed in the mask layer 32.

Figure 2C:
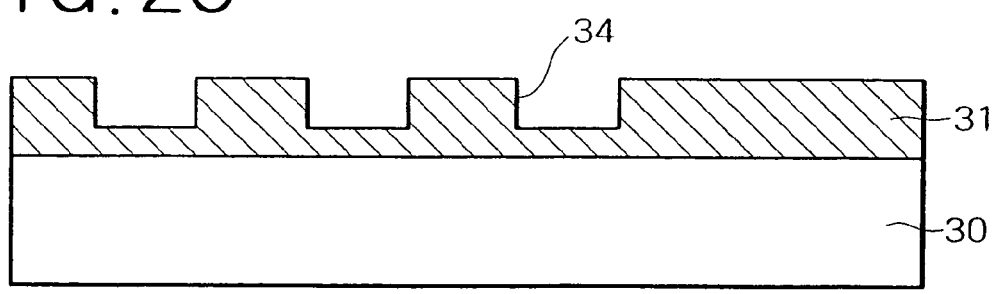

A surface of the GaN layer 31 is selectively etched by using the mask layer 32 as a mask, so that the surface of the GaN layer 31 is selectively cut off in a pattern depending on the pattern of the stripe shaped opening portions 33, to form stripe shaped difference-in-height portions 34. The difference-in-height portion 34 has a high-level portion located directly under a mask portion of the mask layer 32, and a low-level portion located under the opening portion 33. After the difference-in-height portions 34 are formed, the mask layer 32 is removed by hydrofluoric acid or the like. Such a state is shown in FIG. 2C.

Figure 2D:
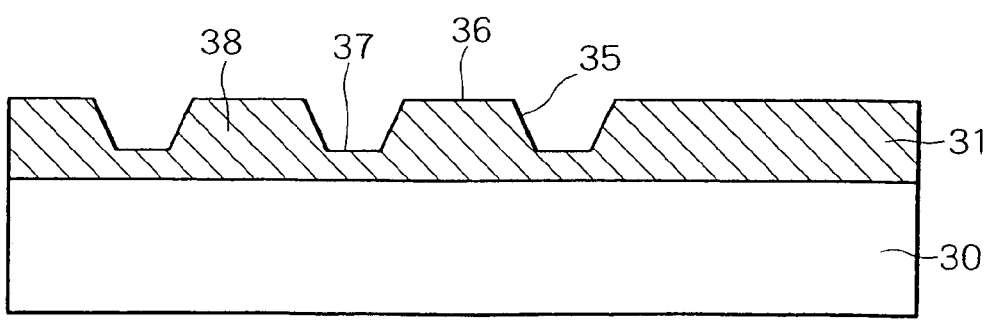

As shown in FIG. 2D, a crystal growth layer including facet structures each having inclined planes is formed by epitaxial growth on the surface, having the difference-in-height portions 34, of the GaN layer 31. The epitaxial growth may be performed, after the substrate temperature is raised, in accordance with a vapor phase epitaxial (VPE) process, an organic metal chemical vapor deposition (MOCVD), or the like. During crystal growth, there appears a facet structure 38 having inclined planes 35 with elapsed time due to a difference in crystal growth rate between different planes of each difference-in-height portion 34. The inclined plane 35 may be typically the {11–22} plane or the S-plane. Depending on the shape of the stripe shaped difference-in-height portion 34, a pair of the inclined planes 35 are opposed to each other at the low-level portion, that is, the valley of the difference-in-height portion 34. In accordance with this embodiment, a facet bottom surface portion 37 composed of the flat C-plane is formed between the pair of inclined planes 35, and a facet top surface portion 36 is formed by crystal growth on the high-level portion, kept at the C-plane, of the difference-in-height portion 34.

Figure 2E:
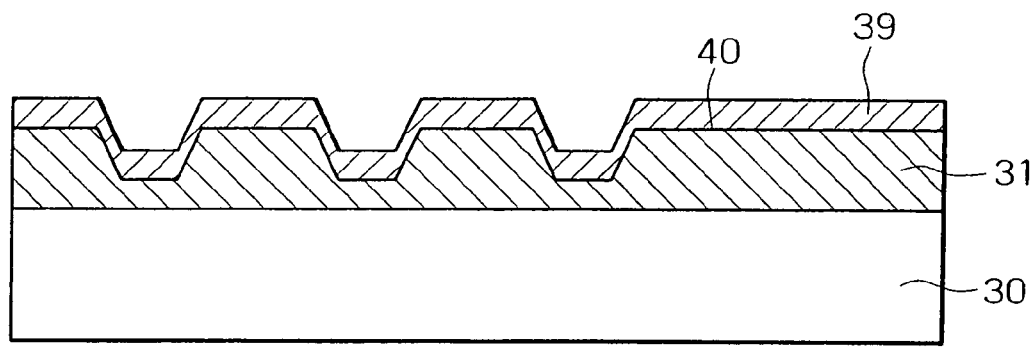

As shown in FIG. 2E, after the crystal growth layer including the facet structures 38 each having the inclined planes 35, the facet bottom surface portion 37, and the facet top surface portion 36 is formed, a GaN layer doped with Si is formed on the crystal growth layer, an InGaN layer is formed thereon under a condition that the growth temperature is lowered, and a GaN layer 39 doped with Mg is formed thereon. The GaN layer doped with Si functions as a first conductive cladding layer, the InGaN layer functions as an active layer, and the GaN layer 39 doped with Mg functions as a second conductive cladding layer. It is to be noted that the GaN layer doped with Si and the InGaN layer, which are formed under the GaN layer 39 doped with Mg, are depicted by a line 40 in FIG. 2E. These layers forming a light emission region, which are formed on the facet structures 38 each having the inclined planes 35, extend in parallel to the inclined planes 35 and also extend in parallel to the facet bottom surface portion 37 having the C-plane and the facet top surface portion 36 having the C-plane. A thickness of the InGaN layer may be in a range of about 0.5 nm to about 6 nm. The InGaN layer may be replaced with a quantum well structure having an (Al)GaN/InGaN structure, a multi-quantum well structure, a multi-structure using a GaN layer or an InGaN layer as a guide layer, or other like structure. At this time, an AlGaN layer may be grown on the InGaN layer. In this regard, since the active layer and the cladding layers are directly formed on the facet structures 38 each having the inclined planes 35, it is possible to eliminate the need of provision of a step of burying the facet structures each having the inclined planes with the GaN layer.

Figure 2F:
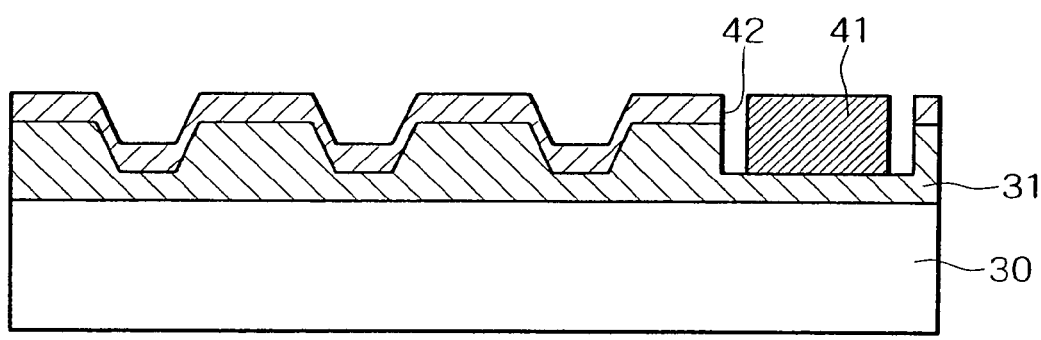

As shown in FIG. 2F, like Example One, part of the stacked layers are removed, to form an opening portion 42 reaching the GaN layer 31. A Ti/Al/Pt/Au electrode is formed by vapor deposition on a portion, exposed within the opening portion 42, of the GaN layer 31. The Ti/Al/Pt/Au electrode is taken as an n-side electrode 41 as shown in FIG. 2F.

After the n-side electrode 41 is formed, like Example One, an Ni/Pt/Au electrode or Ni(Pd)/Pt/Au electrode is formed by vapor deposition on the uppermost one of the stacked layers, that is, the GaN layer 39 doped with Mg. The Ni/Pt/Au electrode or Ni(Pd)/Pt/Au electrode is taken as a p-side electrode 43 as shown in FIG. 2G.

Figure 2G:
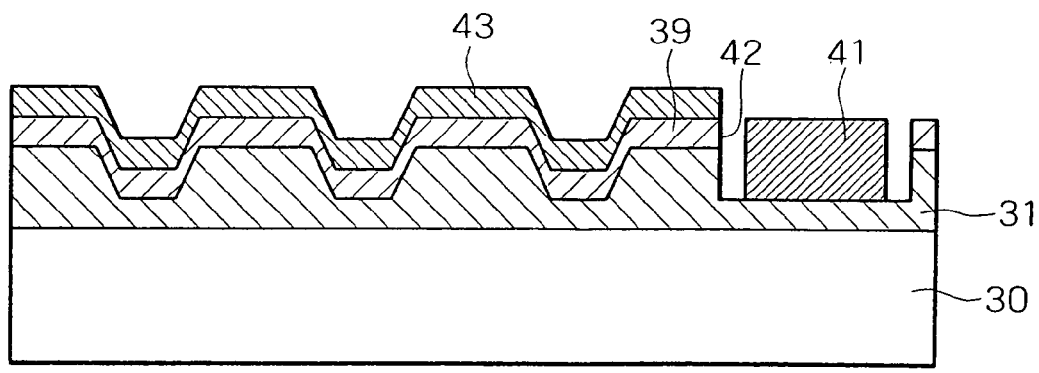

The semiconductor light emitting device thus fabricated has a structure shown in FIG. 2G. As described above, the GaN layer 31 doped with silicon is formed on the sapphire substrate 30 with the C+ plane of sapphire taken as the substrate principal plane; the facet structures 38 each having the inclined planes 35 which are inclined with respect to the C+ plane by making use of the difference-in-height portions 34 formed in the surface of the GaN layer 31; and the GaN layer doped with Si, the InGaN layer, and the GaN layer 39 doped with Mg are formed in such a manner as to extend on the planes parallel to the inclined planes 35 and on the planes parallel to the C-plane. In this structure, the InGaN layer held between the two GaN layers is taken as the active layer for emitting light. When a current is supplied to the active layer between the p-side electrode 43 connected to the GaN layer 39 doped with Mg and the n-side electrode 41 connected to the GaN layer 31 doped with Si, there occurs light emission of the semiconductor light emitting device having the above structure.

In the semiconductor light emitting device having the above structure, the facet structures 38 each having the inclined planes 35 are formed before the active layer is formed, and consequently, even if through-dislocations are propagated from the substrate, the propagation of the through-dislocations is deflected by the inclined planes 35, with a result that it is possible to suppress occurrence of crystal defects. In this embodiment, since it is not required to bury the facet structures 38 each having the inclined planes 35 with the GaN layer, it is possible to reduce the number of steps and to decrease a time required for fabricating the light emitting device; and since the cladding layers and the active layer are formed by making use of the inclined planes 35 which are inclined with respect to the substrate principal plane, it is possible to form a light emission region with good crystallinity because the number of bonds of gallium to nitrogen becomes larger at each inclined plane 35.

As previously discussed, the semiconductor device of the present invention can be applied in a variety of suitable applications.

EXAMPLE THREE

A semiconductor light emitting device in accordance with an embodiment of the present invention can be fabricated by making use of a crystal growth layer which is formed in a pattern of inverse-hexagonal pyramid shapes overall on a substrate principal plane. As shown in FIG. 3, a perspective view of a crystal growth layer used for fabricating the semiconductor light emitting device of an embodiment of the present invention is provided. Like the first and second examples, the crystal growth layer is obtained by forming a GaN layer 51 doped with silicon on a sapphire substrate 50, forming difference-in-height portions (not shown) in the GaN layer 51 doped with silicon, and growing a GaN layer 53 doped with silicon in a pattern of inverse-hexagonal pyramid shapes as shown in FIG. 3.

As shown in FIG. 4A, a plurality of equilateral hexagonal shaped recesses 61 are formed in a flat surface of the GaN layer 51 in such a manner that the opposed sides of the adjacent two of the recesses 61 are separated from each other with a specific gap put therebetween like a honeycomb pattern or are in contact with each other. To grow an inverse-hexagonal pyramid shaped crystal 63 shown in FIG. 4B, an end portion 62 of the equilateral hexagonal recess, that is, the difference-in-height portion 61 may extend, for example, in the direction perpendicular to the <1–100> direction or the <11–20> direction. An angle of the lowest portion of the inverse-hexagonal pyramid shape 63 can be set to about 60° by adjusting a crystal growth condition. In this case, the crystal layer can be grown in a pattern of inverse-equilateral hexagonal pyramid shapes. In addition, the crystal layer can be also grown in a pattern of truncated inverse-hexagonal pyramid shapes each having a bottom plane taken as the C-plane.

After the GaN layer 53 doped with silicon is formed in a pattern of inverse-hexagonal pyramid shapes shown in FIG. 3, a GaN layer doped with Si, an InGaN layer, a GaN layer doped with Mg are sequentially stacked on the GaN layer 53. Since each inverse-hexagonal pyramid of the pattern of the GaN layer 53 has inclined planes for forming a facet structure, the layers stacked thereon extend in parallel to the inclined planes. The InGaN layer held between the two GaN layers acts as an active layer for light emission. It is to be noted that, in the fabrication process according to an embodiment, respective layers are grown at about normal or standard pressure, for example, about 740 Torr.

As previously discussed, the semiconduction device of the present invention can be applied in a variety of different and suitable applications.

EXAMPLE FOUR

In an embodiment, an approximately V-shaped light emission region is formed by using a stripe shaped difference-in-height portion, and an electrode is formed in the light emission region. The processing steps will be described with reference to FIGS. 5A to 5F.

Figure 5A:
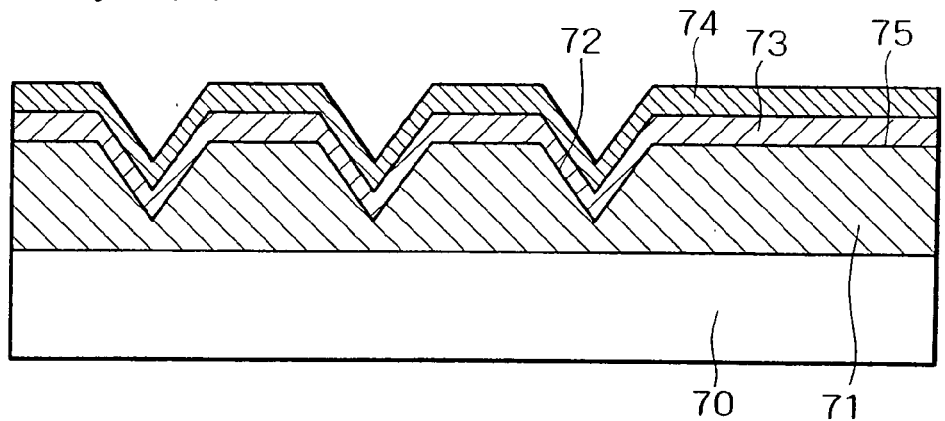
FIGS. 5A to 5F are sectional views showing steps of fabricating a semiconductor light emitting device according to an embodiment of the present invention.

A GaN layer 71 doped with silicon is formed on a principal plane (C+ plane) of a sapphire substrate 70. A low temperature buffer layer may be formed before the GaN layer 71 doped with silicon is formed. Like Example Two, stripe shaped difference-in height portions are formed in a surface of the GaN layer 71 doped with silicon, followed by continuation of crystal growth by using the difference-in-height portions, to obtain the GaN layer 71 having approximately V-shaped valleys 72 as shown in FIG. 5A. The approximately V-shaped valley 72 is formed by inclined planes opposed to each other at a specific angle. The inclined plane is selected from the S-plane, the {11–22} plane, and planes being substantially equivalent thereto. Although a bottom of the valley 72 is V-shaped at a specific angle as shown, a plane parallel to the C-plane may appear on the bottom of the valley 72.

A GaN layer doped with Si, an InGaN layer 75 shown by a line in the figure, and a GaN layer 73 doped with Mg are sequentially stacked on the GaN layer 71. The GaN layer doped with Si, the InGaN layer 75, and the GaN layer 73 doped with Mg form a light emission region. Even at each approximately V-shaped valley 72, the light emission region is formed by the stacked structure of the GaN layer doped with Si, the InGaN layer 75, and the GaN layer 73 doped with Mg. Subsequently, a silicon oxide layer 74 is formed overall on the stacked structure in such a manner as to cover the inside of each approximately V-shaped valley 72. It is to be noted that in the fabrication process, respective layers are grown at about normal or standard pressure, for example, about 740 Torr.

Figure 5B:
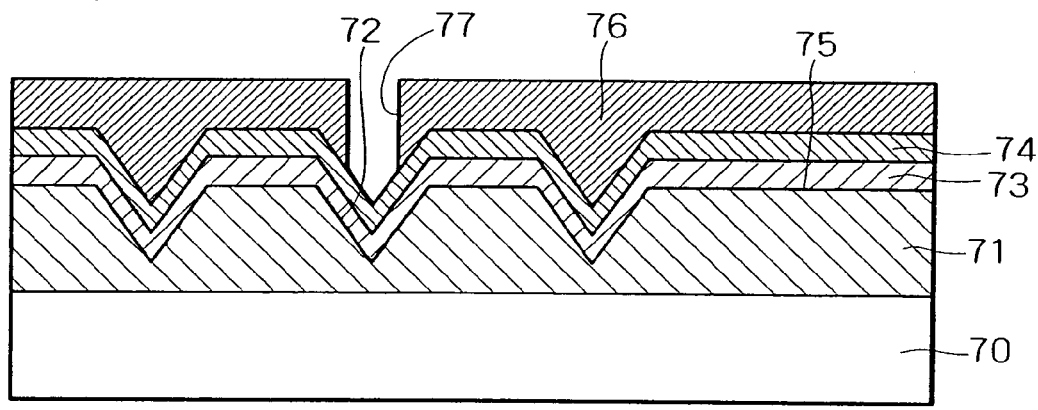

After formation of the silicon oxide layer 74 overall on the stacked structure, a resist layer 76 is formed overall on the silicon oxide layer 74. As shown in FIG. 5B, an opening portion 77 is formed, by a photolithography technique, in the resist layer 76 at a position corresponding to the approximately V-shaped valley 72 in which an electrode is to be formed. The depth of the opening portion 77 reaches the surface of the silicon oxide layer 74. In addition, the width of the opening portion 72 is shorter than a width of an opening of the approximately V-shaped valley 72, so that only the inclined planes of the valley 72 are exposed within the opening portion 77.

Figure 5C:
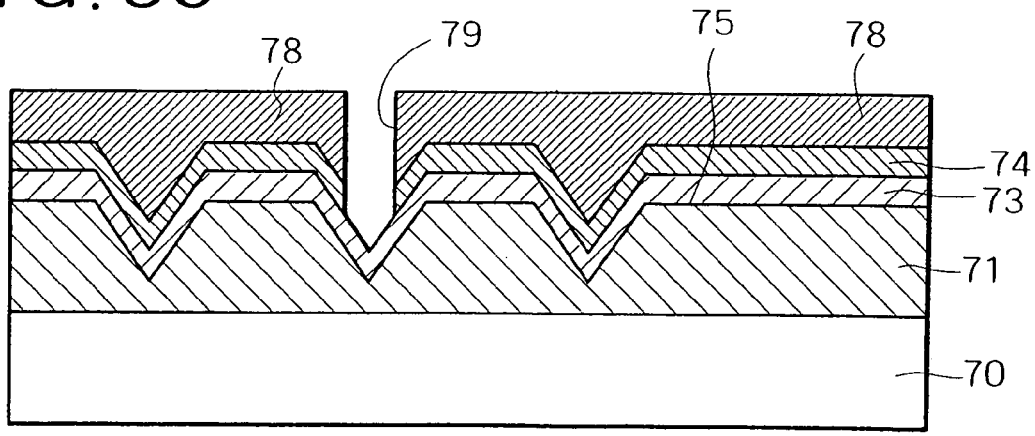

A portion of the silicon oxide layer 74, located at the position corresponding to the approximately V-shaped valley 72, is removed by RIE (Reactive Ion Etching) or wet etching using a hydrofluoric acid based etchant via the opening portion 77 of the resist layer 76. With the partial removal of the silicon oxide layer 74 at the valley 72, the GaN layer 73 doped with Mg is exposed at the valley 72. The resist layer 76 is then removed and a resist layer 78 for forming an electrode by a liftoff process is formed. The resist layer 78 has a window portion 79 at a position at which the surface of the GaN layer 73 is exposed. More specifically, as shown in FIG. 5C, a cross-sectional portion of the silicon oxide layer 74 and the GaN layer 73 doped with Mg are exposed within the window portion 79 of the resist layer 78.

Figure 5D:
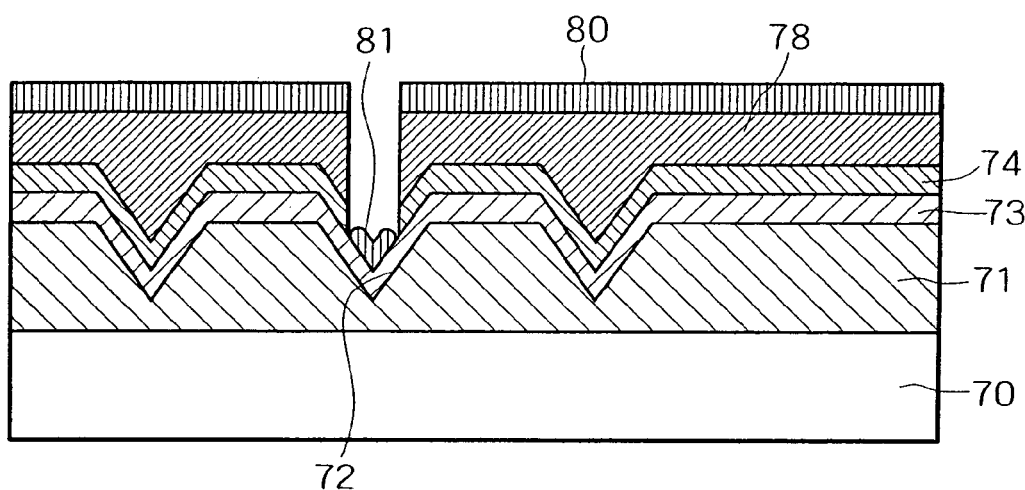

After the mask of the resist layer 78 and the silicon oxide layer 74 is formed, as shown in FIG. 5D, a p-side electrode material such as Ni/Pt/Au or Ni(Pd)/Pt/Au is deposited via the window portion 79, to form a p-side electrode material layer 80. Since a height difference equivalent to the total height of the resist layer 78 and the silicon oxide layer 74 lies between the top and the bottom of the window portion 79, the film is thinned or not formed at the stepped portion of the window portion 79, whereby a p-side electrode 81 being approximately V-shaped in cross section is formed at the valley 72.

Figure 5E:
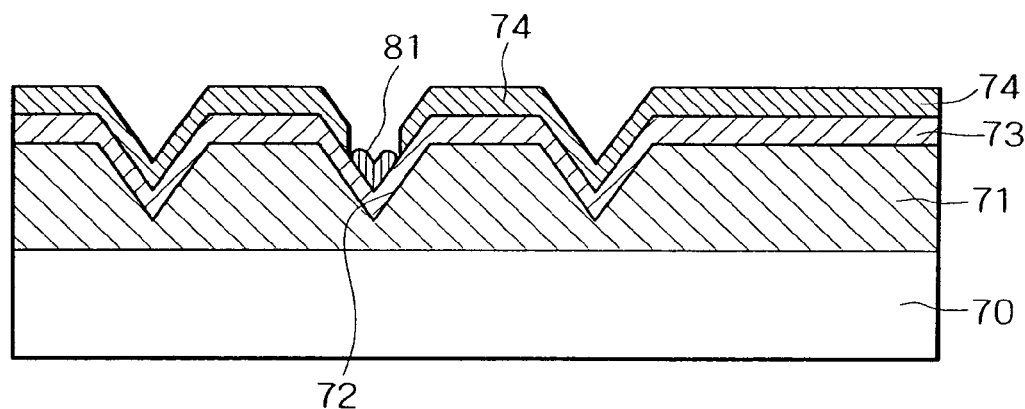
Figure 5F:
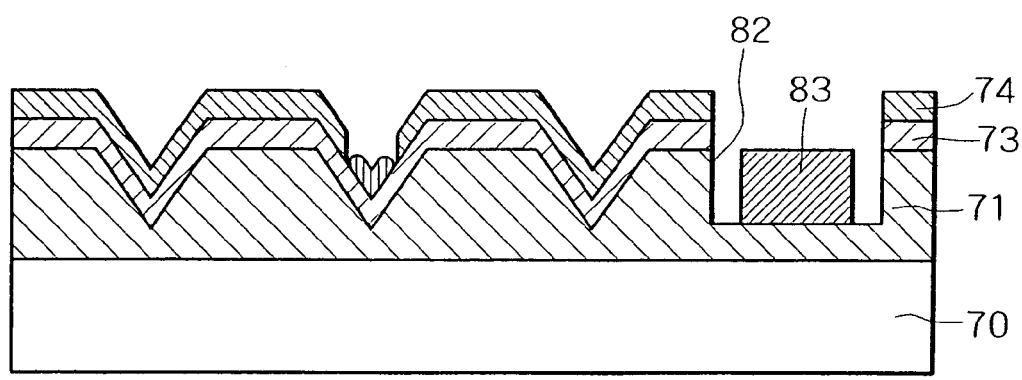

After the p-side electrode 81 is formed at the valley 72, as shown in FIG. 5E, the resist layer 78 on the silicon oxide layer 74 is removed (that is, lifted off) by using a solvent such as acetone, to remove the p-side electrode material layer 80 excluding the p-side electrode 81 at the valley 72. Finally, an opening portion 82 is formed in such a manner as to reach the GaN layer 71 doped with Si, and an n-side electrode 83 is formed as shown in FIG. 5F.

In accordance with the above-described fabrication steps, even when an approximately V-shaped light emission region is formed by using a stripe shaped difference-in-height portion, the p-side electrode 81 being approximately V-shaped in cross-section can be formed at the valley 72 in the light emission region, to allow injection of a current in the light emission region.

EXAMPLE FIVE

In an embodiment, the semiconductor device of the present invention can include substantially V-shaped valleys that are formed by using stripe shaped difference-in-height portions, a light emission region that is formed in a flat portion, parallel to the C-plane, located between the valleys, and an electrode that is formed in the light emission region. The processing steps of this example will be described with reference to FIGS. 6A to 6D.

Figure 6A:
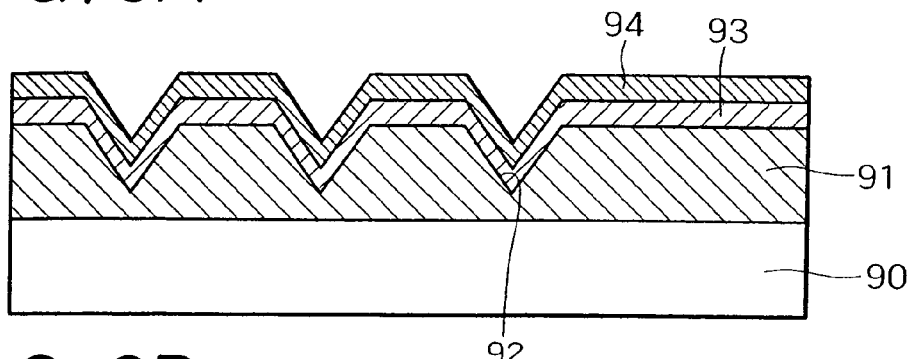
FIGS. 6A to 6D are sectional views showing steps of fabricating a semiconductor light emitting device according to an embodiment of the present invention.

A GaN layer 91 doped with silicon is formed on a principal plane (C+ plane) of a sapphire substrate 90. A low temperature buffer layer may be formed before the GaN layer 91 doped with silicon is formed. Like the second embodiment, stripe shaped difference-in height portions are formed in a surface of the GaN layer 91 doped with silicon, followed by continuation of crystal growth by using the difference-in-height portions, to obtain the GaN layer 91 having approximately V-shaped valleys 92 as shown in FIG. 6A. The approximately V-shaped valley 92 is formed by inclined planes opposed to each other at a specific angle. The inclined plane is selected from the S-plane, the {11–22} plane, and planes being substantially equivalent thereto. Although a bottom of the valley 92 is V-shaped at a specific angle in this embodiment, a plane parallel to the C-plane may appear on the bottom of the valley 92.

A GaN layer doped with Si, an InGaN layer shown by a line in the figure, and a GaN layer 93 doped with Mg are sequentially stacked on the GaN layer 91. The GaN layer doped with Si, the InGaN layer, and the GaN layer 93 doped with Mg form a light emission region. Even at each approximately V-shaped valley 92, the light emission region is formed by the stacked structure of these GaN layer doped with Si, the InGaN layer, and the GaN layer 93 doped with Mg. Subsequently, a silicon oxide layer 94 is formed overall on the stacked structure in such a manner as to cover the inside of each approximately V-shaped valley 92. It is to be noted that in the fabrication process, respective layers are grown at about normal pressure, for example, about 740 Torr.

Figure 6B:
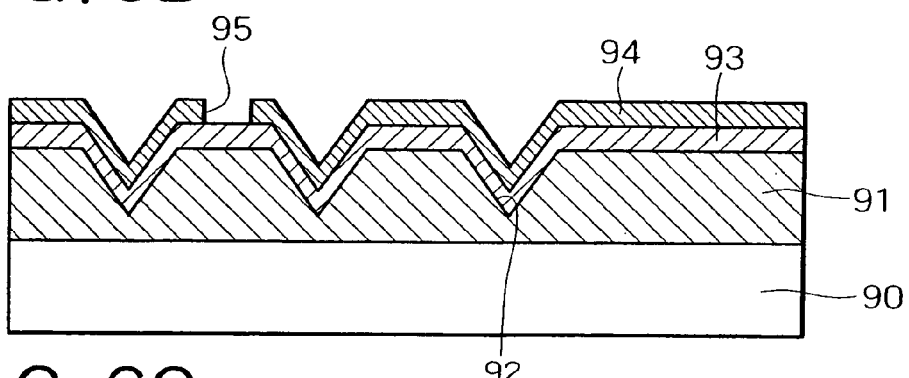

After formation of the silicon oxide layer 94 overall on the stacked structure, as shown in FIG. 6B, a resist layer is formed overall on the silicon oxide layer 94 and an opening portion is formed, by the photolithography technique, in the resist layer at a position corresponding to a flat portion, parallel to the C-plane, in which an electrode is to formed. A portion of the silicon oxide layer 94, located at the opening portion, is removed by RIE or wet etching using, for example, a hydrofluoric acid-based etchant, to form a window portion 95 having a shape corresponding to that of the opening portion in the silicon oxide layer 94. The depth of the window portion 95 reaches the surface of the silicon oxide layer 93 doped with Mg.

After formation of the window portion 95, a resist layer 96 for forming a p-side electrode, which has a window portion 96d, is formed by photolithography. The window portion 96d is slightly wider than the window portion 95, so that part of the silicon oxide layer 94 and the surface of the GaN layer 93 doped with Mg are exposed within the window portion 96d.

Figure 6C:
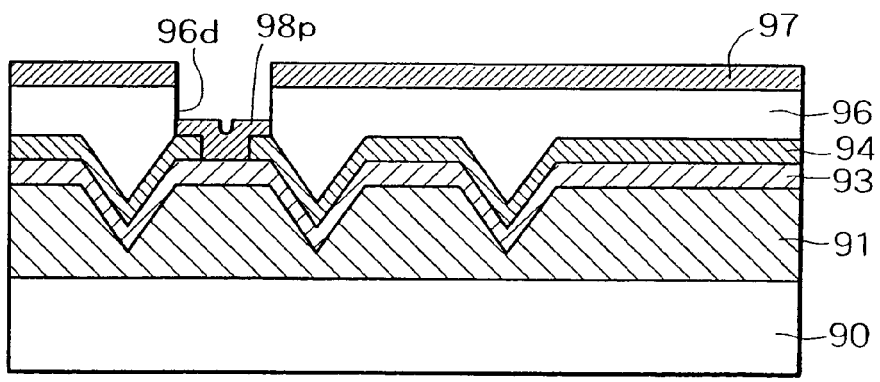

After the mask of the resist layer 96 and the silicon oxide layer 94 is formed, as shown in FIG. 6C, a p-side electrode material such as Ni/Pt/Au or Ni(Pd)/Pt/Au is deposited via the window portion 96d, to form a p-side electrode material layer 97. Since a height difference equivalent to the total height of the resist layer 96 and the silicon oxide layer 94 lies between the top and the bottom of the window portion 96d, the film is thinned or not formed at the stepped portion of the window portion 96d, whereby a p-side electrode 98 having a plug-like shape with flanges on the upper side in cross section is formed in the window portion 95.

Figure 6D:
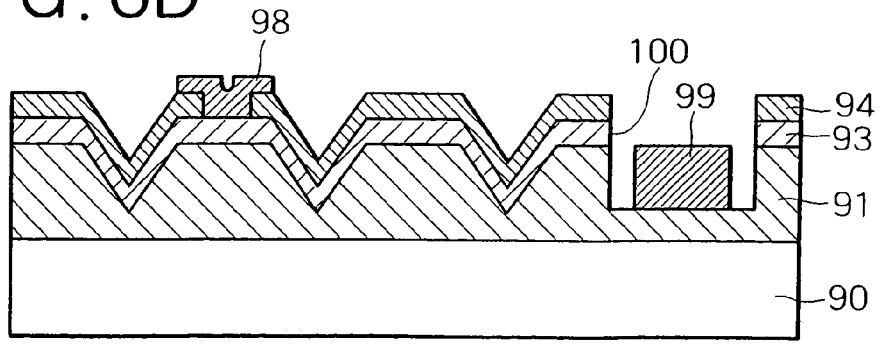

After the p-side electrode 98 is formed, as shown in FIG. 6D, the resist layer 96 on the silicon oxide layer 94 is removed by using a solvent such as acetone, to remove the p-side electrode material layer 97 excluding the p-side electrode 98. Finally, an opening portion 100 is formed in such a manner as to reach the GaN layer 91 doped with Si, and an n-side electrode 99 is formed.

According to the above-described fabrication steps, even when approximately V-shaped valleys are formed by using stripe shaped difference-in-height portions and a light emission region is formed in a flat portion, parallel to the C-plane, located between the valleys, the plug-like p-side electrode 98 can be formed on the flat portion in the light emission region, to allow injection of a current in the light emission region.

EXAMPLE SIX

Figure 7:
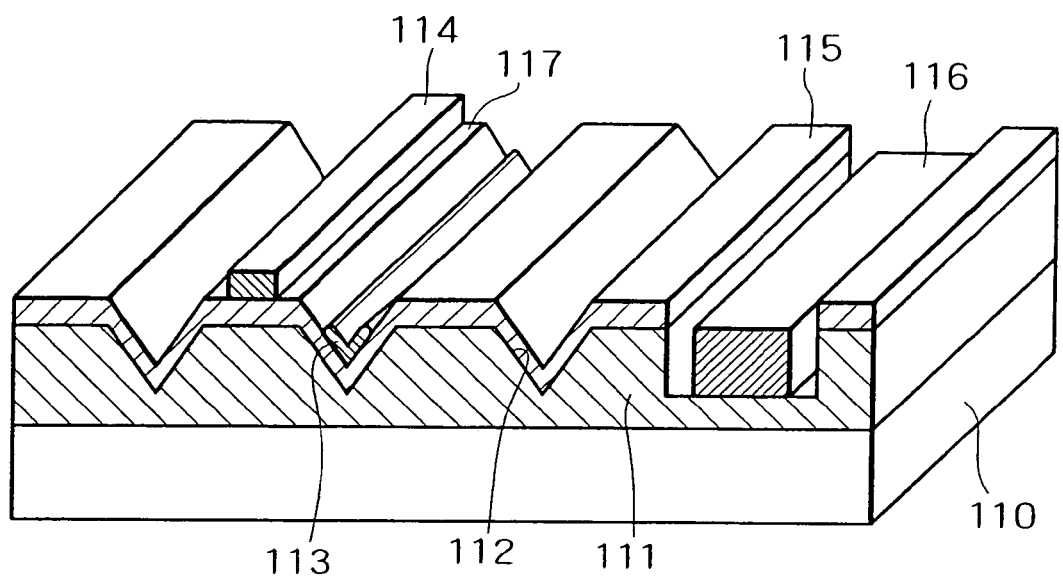
FIG. 7 is a sectional perspective view showing a semiconductor light emitting device according to an embodiment of the present invention.

As shown in FIG. 7, a multi-color light emitting device is fabricated, wherein two independent electrodes are provided to form a long-wavelength light emission region and a short-wavelength light emission region in accordance with an embodiment of the present invention.

A GaN layer 111 doped with silicon is formed on a principal plane (C+ plane) of a sapphire substrate 110, and different-in-height portions are formed in a surface of the GaN layer 111. Subsequently, facet structures each having inclined planes 112 inclined with respect to the substrate principal plane are formed by making use of the difference-in-height portions. It is to be noted that in the fabrication process, respective layers are formed at about normal pressure, for example, about 740 Torr. A stacked structure of a GaN layer doped with Si, an InGaN layer, and a GaN layer 115 doped with Mg is formed so as to extend on a plane parallel to the inclined planes 112 and the C-plane. The InGaN layer held between the two GaN layers acts as an active layer for emitting light.

As shown in FIG. 7, an n-side electrode 116 is connected to the GaN layer 111 doped with Si; and a p-side electrode is composed a p-side electrode 113 for a long-wavelength light emission region, which is positioned at an approximately V-shaped valley formed by the inclined planes 112, and a p-side electrode 114 for a short-wavelength light emission region, which is formed on a flat portion 117 between the adjacent approximately V-shaped valleys. An active layer formed at the approximately V-shaped valley has a structure determined on the basis of a composition and a thickness of the active layer, which structure allows emission of light having a long-wavelength, for example, emission of light of green or red. In this regard, by injecting a current in the active layer via the p-side electrode 113, it is possible to realize emission of light having a long-wavelength, for example, emission of light of green or red. An active layer formed on the flat portion 117 between the adjacent approximately V-shaped valleys has a structure determined on the basis of a composition and a thickness of the active layer, which structure allows emission of light having a short-wavelength, for example, emission of light of blue. In this regard, by injecting a current in the active layer via the p-side electrode 114, it is possible to realize emission of light having a short-wavelength, for example, emission of light of blue.

Even if through-dislocations are propagated from the substrate, the propagation of the through-dislocations is deflected by the inclined planes 112, to suppress occurrence of crystal defects, and since the facet structures are not buried with the GaN layer, it is possible to fabricate the device for a relatively short time without increasing the number of processing steps. Further, light emission regions for emitting light having different wavelengths can be formed on the same device by making use of a difference in composition and thickness between one or more of the active layers formed on respective crystal planes of the facet structure. In this regard, since the p-side electrodes 113 and 114 are disposed on the upper and lower sides of the difference-in-height portion, it is possible to form electrodes in micro-sized light emission regions without occurrence of any problem of short-circuit.

EXAMPLE SEVEN

Figure 8:
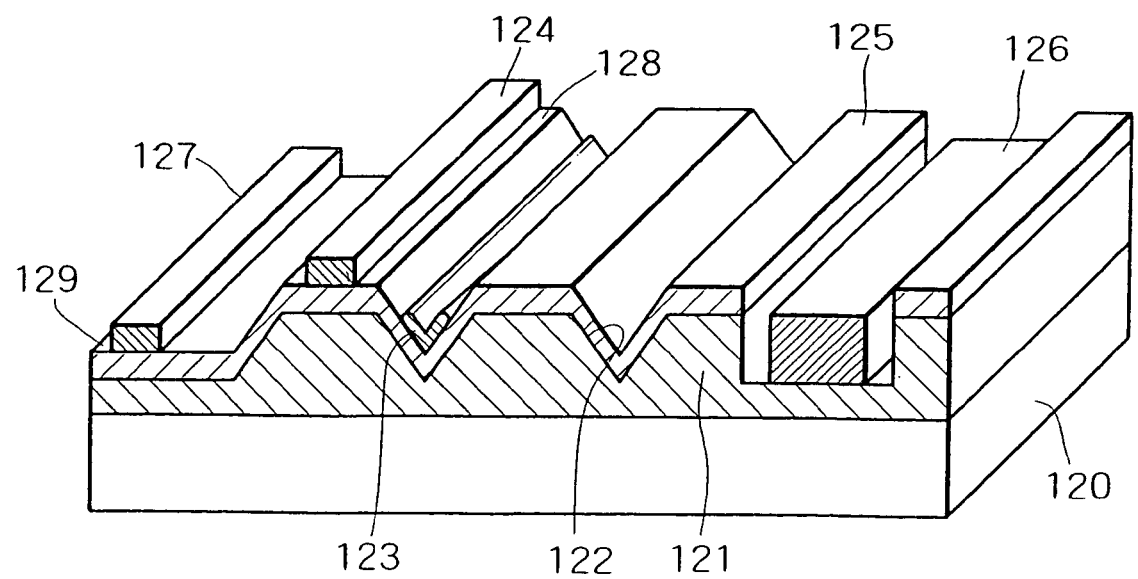
FIG. 8 is a sectional perspective view showing a semiconductor light emitting device according to an embodiment of the present invention.

As shown in FIG. 8, a multi-color light emitting device in accordance with an embodiment of the present invention is provided, is fabricated, wherein three independent electrodes are provided to form a red light emission region, a green light emission region, and a blue light emission region.

A GaN layer 121 doped with silicon is formed on a principal plane (C+ plane) of a sapphire substrate 120, and different-in-height portions are formed in a surface of the GaN layer 121. Subsequently, facet structures each having inclined planes 122 inclined with respect to the substrate principal plane are formed by making use of the difference-in-height portions. It is to be noted that in the fabrication process, respective layers are formed at about normal pressure, for example, about 740 Torr. A stacked structure of a GaN layer doped with Si, an InGaN layer, and a GaN layer 125 doped with Mg is formed so as to extend on a plane parallel to the inclined planes 122 and the C-plane. The InGaN layer held between the two GaN layers acts as an active layer for emitting light.

In an embodiment, to the semiconductor light emitting device of the present invention includes an n-side electrode 126 is connected to the GaN layer 121 doped with Si; and a p-side electrode is composed a p-side electrode 123 for a red light emission region, which is positioned at an approximately V-shaped valley formed by the inclined planes 122, a p-side electrode 124 for a blue light emission region, which is formed on an upper flat portion 128 between the adjacent approximately V-shaped valleys, and a p-side electrode 127 for a green light emission region, which is formed on a lower flat portion 129. An active layer formed at the approximately V-shaped valley has a structure determined on the basis of a composition and a thickness of the active layer, which structure allows emission of light of red. In this regard, by injecting a current in the active layer via the p-side electrode 123, it is possible to realize emission of light of red. An active layer formed on the upper flat portion 128 between the adjacent approximately V-shaped valleys has a structure determined on the basis of a composition and a thickness of the active layer, which structure allows emission of light of blue. In this regard, by injecting a current in the active layer via the p-side electrode 124, it is possible to realize emission of light of blue. An active layer formed on the lower flat portion 129 has a structure determined on the basis of a composition and a thickness of the active layer, which structure allows emission of light of green, and accordingly, by injecting a current in the active layer via the p-side electrode 127, it is possible to realize emission of light of green.

Even if through-dislocations are propagated from the substrate, the propagation of the through-dislocations is deflected by the inclined planes 122, to suppress occurrence of crystal defects, and since the facet structures are not buried with the GaN layer, it is possible to fabricate the device for a relatively short time without increasing the number of processing steps. Further, light emission regions for emitting light having different wavelengths, particularly, light of red, blue, and green can be formed on the same device by making use of a difference in composition and thickness between one or more of the active layers formed on respective crystal planes of the facet structure. In this regard, since the p-side electrodes 123, 124, and 127 are disposed at three different points of the difference-in-height portion, that is, spatially separated from each other, it is possible to form electrodes in micro-sized light emission regions without occurrence of any problem of short-circuit.

Figure 9:
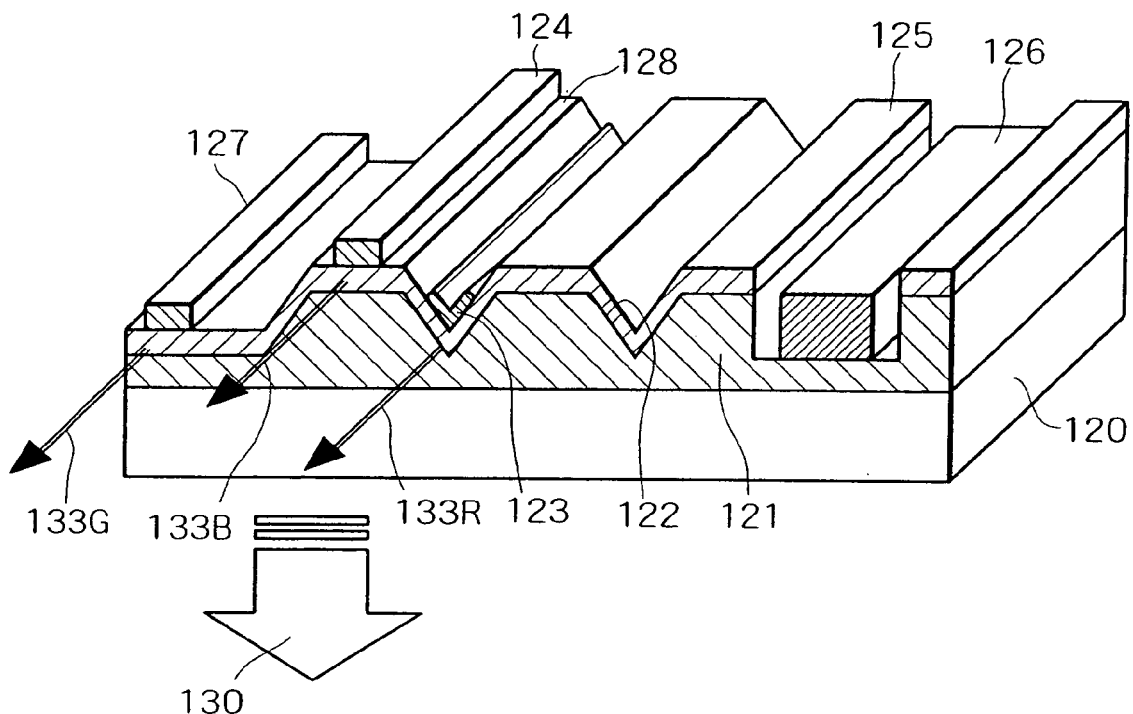
FIG. 9 is a sectional perspective view showing an example of a light emission state of the semiconductor light emitting device according to an embodiment of the present invention.

FIG. 9 illustrates a state in which light is emitted from the semiconductor light emitting device according to an embodiment of the present invention such that the semiconductor light emitting device can be used, for example, as a light emitting diode. In this case, light 130 is emerged from the back side of the device. The light 130 may be light of a single color, multi-colors, or a mixture of colors. The colors of light 130 can be controlled by applying currents to the p-side electrodes 123, 124, and 127. It should be appreciated that the semiconductor light emitting device of the present invention can be in a variety of other suitable applications, including a semiconductor laser by forming a resonator end face at an end portion of the device. In the example shown in FIG. 9, red laser light 133R, blue laser light 133B, and green laser light 133G are emerged from the end face of the resonator of the device. The end face of the resonator may be formed by cleavage.

EXAMPLE EIGHT

Figure 10:
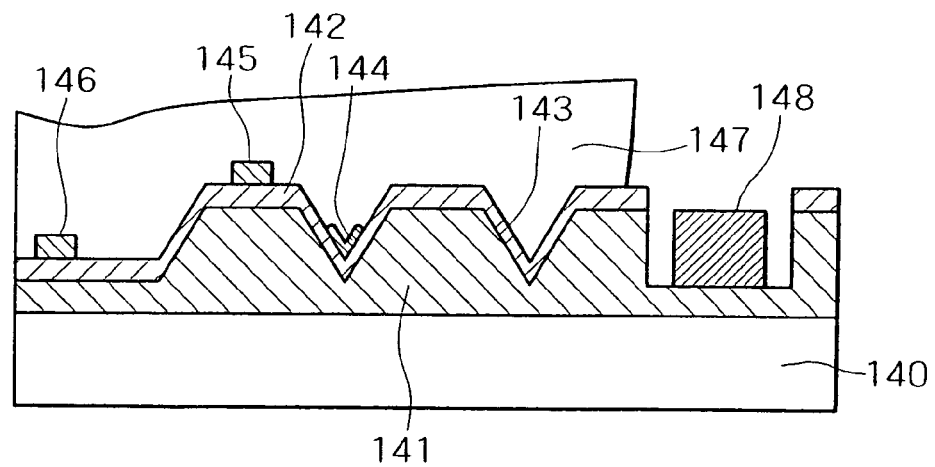
FIG. 10 is a sectional perspective view showing a semiconductor light emitting device according to an embodiment of the present invention.

According to an embodiment of the present invention, a semiconductor light emitting device capable of emitting white light can be fabricated, wherein as shown in FIG. 10, three independent electrodes are formed, and a common electrode for commonly driving the three electrodes is provided.

A GaN layer 141 doped with silicon is formed on a principal plane (C+ plane) of a sapphire substrate 140, and different-in-height portions are formed in a surface of the GaN layer 141. Subsequently, facet structures each having inclined planes 143 inclined with respect to the substrate principal plane are formed by making use of the difference-in-height portions. These fabrication steps are the same as those described in the previous embodiments. A stacked structure of a GaN layer doped with Si, an InGaN layer, and a GaN layer 142 doped with Mg is formed so as to extend on a plane parallel to the inclined planes 143 and the C-plane. The InGaN layer held between the two GaN layers acts as an active layer for emitting light.

According to an embodiment, the semiconductor of the present invention can include an n-side electrode 148 that is connected to the GaN layer 141 doped with Si via an opening portion; and a p-side electrode is, like Example Seven, composed a p-side electrode 144 for a red light emission region, which is positioned at an approximately V-shaped valley formed by the inclined planes 143, a p-side electrode 145 for a blue light emission region, which is formed on an upper flat portion between the adjacent approximately V-shaped valleys, and a p-side electrode 146 for a green light emission region, which is formed on a lower flat portion. In an embodiment, a common electrode 147 for commonly driving the p-side electrodes 144, 145 and 146 is formed. With the acid of this common electrode 147, the device fabricated as the multi-color light emitting device can be used as a light emitting device capable of emitting white light.

Even if through-dislocations are propagated from the substrate, the propagation of the through-dislocations is deflected by the inclined planes 143, to suppress occurrence of crystal defects, and since the facet structures are not buried with the GaN layer, it is possible to fabricate the device for a relatively short time without increasing the number of processing steps. Further, according to an embodiment, since light emission regions for emitting light of red, blue, and green can be formed on the same device by making use of a difference in composition and thickness between one or more of the active layers formed on respective crystal planes of the facet structure, it is possible to emit white light by commonly driving the electrodes formed in the light emission regions. The semiconductor light emitting device of the present invention, therefore, can be used as an illuminating unit or applied in a variety of other suitable applications.

EXAMPLE NINE

Figure 11:
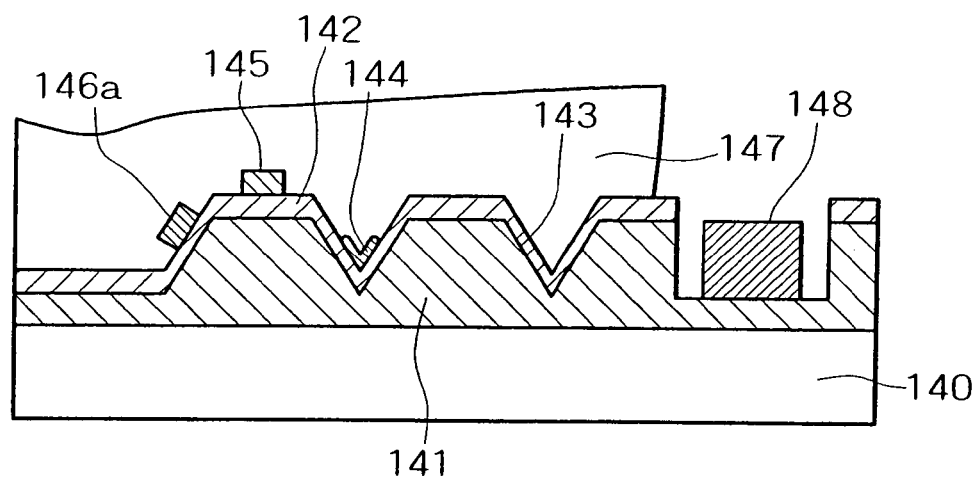
FIG. 11 is a sectional perspective view showing a semiconductor light emitting device according to an embodiment of the present invention.

In an embodiment of the present invention, a semiconductor light emitting device capable of emitting white light is fabricated, wherein as shown in FIG. 11, three independent electrodes are formed, and a common electrode for commonly driving the three electrodes is provided.

A GaN layer 141 doped with silicon is formed on a principal plane (C+ plane) of a sapphire substrate 140, and different-in-height portions are formed in a surface of the GaN layer 141. Subsequently, facet structures each having inclined planes 143 inclined with respect to the substrate principal plane are formed by making use of the difference-in-height portions. These fabrication steps are the same as those described in the previous embodiments. A stacked structure of a GaN layer doped with Si, an InGaN layer, and a GaN layer 142 doped with Mg is formed so as to extend on a plane parallel to the inclined planes 143 and the C-plane. The InGaN layer held between the two GaN layers acts as an active layer for emitting light.

In an embodiment, the semiconductor device of the present invention includes an n-side electrode 148 is connected to the GaN layer 141 doped with Si via an opening portion; and a p-side electrode is, like Example Seven, composed of a p-side electrode 144 for a red light emission region, which is positioned at an approximately V-shaped valley formed by the inclined planes 143, a p-side electrode 145 for a blue light emission region, which is formed on an upper flat portion between the adjacent approximately V-shaped valleys, and a p-side electrode 146a for a green light emission region, which is formed on the inclined plane 143. In an embodiment, a common electrode 147 for commonly driving the p-side electrodes 144, 145 and 146a is formed. With the acid of this common electrode 147, the device fabricated as the multi-color light emitting device can be used as a light emitting device capable of emitting white light.

Even if through-dislocations are propagated from the substrate, the propagation of the through-dislocations is deflected by the inclined planes 143, to suppress occurrence of crystal defects, and since the facet structures are not buried with the GaN layer, it is possible to fabricate the device for a relatively short time without increasing the number of processing steps. Further, since light emission regions for emitting light of red, blue, and green can be formed on the same device by making use of a difference in composition and thickness between one and another of the active layers formed on respective crystal planes of the facet structure, it is possible to emit white light by commonly driving the electrodes formed in the light emission regions. The semiconductor light emitting according to an embodiment, therefore, can be used as an illuminating unit or applied in other suitable applications.

EXAMPLE TEN

Figure 12:
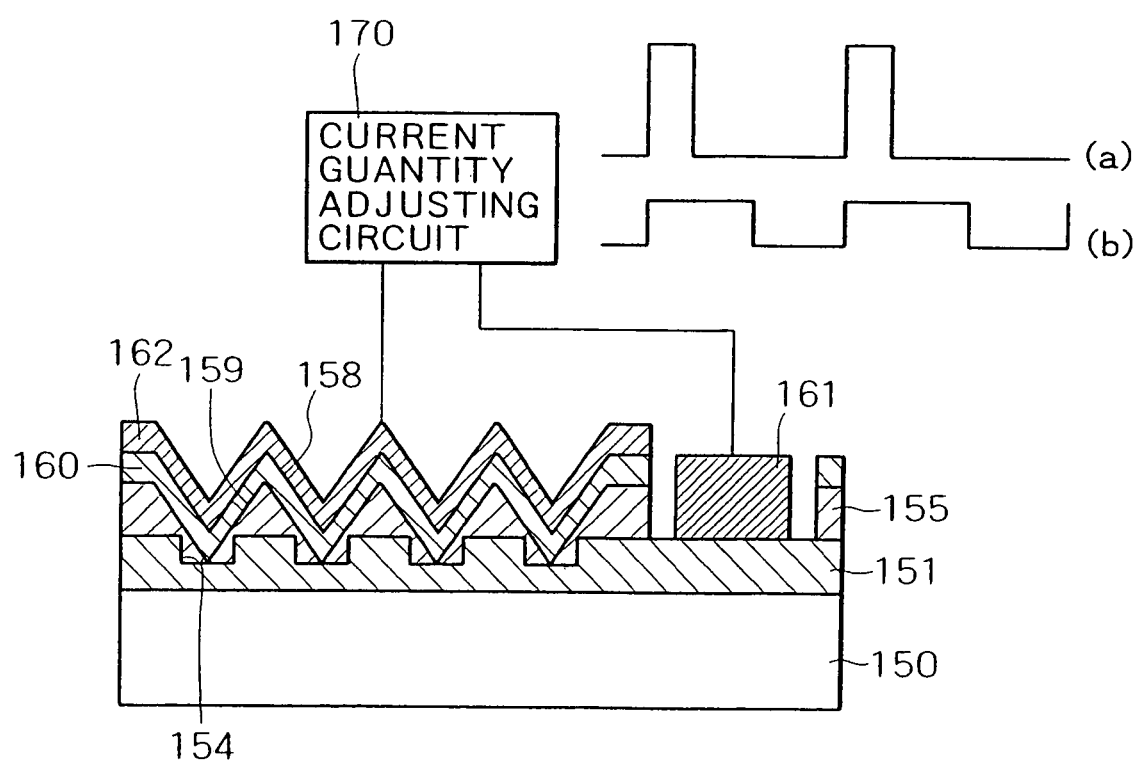
FIG. 12 is a sectional view showing a semiconductor light emitting device according to an embodiment of the present invention, wherein the device is connected to a current quantity adjusting circuit.

In an embodiment, a semiconductor light emitting device of the present invention includes a structure shown in FIG. 12 as fabricated. A GaN layer 151 doped with silicon is formed on a principal plane (C+ plane) of a sapphire substrate 150, and different-in-height portions 154 are formed in a surface of the GaN layer 151. Subsequently, facet structures each having inclined planes inclined with respect to the substrate principal plane are formed by making use of the difference-in-height portions 154. A stacked structure of a GaN layer 159 doped with Si (shown by a line in the figure), an InGaN layer 160, and a GaN layer 158 doped with Mg (shown by a line in the figure) is formed so as to extend on a plane parallel to the inclined planes. The InGaN layer 160 held between the two GaN layers acts as an active layer for emitting light. An n-side electrode 161 is connected to the GaN layer 151 doped with Si, and a p-side electrode 162 is connected to the GaN layer 158 doped with Mg. The device emits light by supplying a current to the active layer between the p-side electrode 162 and the n-side electrode 161.

A current quantity adjusting circuit 170 is connected between the p-side electrode 162 and the n-side electrode 161 for adjusting a current quantity so as to set an emission wavelength of the semiconductor light emitting device to a desired wavelength. For example, the current quantity adjusting circuit 170 can output a signal having a waveform (a) of cyclic pulses each having a short pulse width and a high peak value and a waveform (b) of cyclic pulses each having a relatively long pulse width and a low peak value. When a signal having the waveform (a) is supplied between the p-side electrode 162 and the n-side electrode 161 from the current quantity adjusting circuit 170, light of a short-wavelength can be emitted from the device, and when a signal having the waveform (b) is supplied between the p-side electrode 162 and the n-side electrode 161 from the current quantity adjusting circuit 170, light of a long-wavelength can be emitted from the device. In this way, the emission wavelength can be set to a desired wavelength by controlling a quantity of a current supplied to the device and a waveform of a signal supplied to the device.

As described above, the semiconductor light emitting device and the method of fabricating the semiconductor light emitting device according to an embodiment of the present invention, even if through-dislocations are propagated from the substrate, the propagation of the through-dislocations is deflected by the inclined planes, to suppress occurrence of crystal defects. Further, since the facet structures are not buried with the GaN layer, it is possible to fabricate the device for a relatively short time without increasing the number of processing steps.

Since cladding layers and an active layer are formed on a plane extending in parallel to an inclined plane inclined with respect to the substrate principal plane, a portion having a good crystallinity can be used as a light emission region by making use of the increased number of bonds of gallium to nitrogen at the inclined plane.

With the multi-color semiconductor light emitting device and the method of fabricating the multi-color semiconductor light emitting device according to an embodiment of the present invention, light emission regions for emitting light having different wavelengths, particularly, light of red, blue, and green can be formed on the same device by making use of a difference in composition and thickness between one or more active layers formed on respective crystal planes of a facet structure. Since respective electrodes, for example, p-side electrodes are disposed at three different points of the difference-in-height portion, that is, spatially separated from each other, it is possible to form electrodes in micro-sized light emission regions without occurrence of any problem of short-circuit.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A semiconductor light emitting device comprising:
a substantially planar substrate defining a principal plane;
a compound semiconductor layer formed on the principal plane of the substrate, wherein said compound semiconductor layer includes at least one difference-in-height portion including a horizontal plane parallel to the principal plane of the substrate and multiple adjacent trenches with horizontal bottoms and vertical sidewalls;
a crystal growth layer formed on the surface of the compound semiconductor layer wherein at least a portion of the crystal growth layer includes at least one facet structure oriented along an inclined plane with respect to the surface of the substrate, wherein the growth of said facet structure depends on a shape of the difference-in-height portion wherein the crystal growth layer forms a sawtooth configuration; and
a first conductive layer, an active layer and a second conductive layer formed on the crystal growth layer in a stacked arrangement and oriented along the inclined plane.

2. The device of claim 1 wherein the compound semiconductor layer comprises a wurtzite compound.

3. The device of claim 2 wherein the wurtzite compound forms a layer oriented along a principal place of the substrate and wherein the inclined plane is inclined with respect to the principal plane.

4. The device of claim 1 wherein the inclined plane comprises at least one of a S-plane and a {11–22} plane.

5. The device of claim 1 wherein the difference-in-height portion comprises a shape selected from the group consisting of a stripe shape, a rectangular shape, and combinations thereof.

6. The device of claim 1 wherein the crystal growth layer comprises a shape selected from the group consisting of a stripe shape, a rectangular shape, a round shape, a triangular shape, a hexagonal shape and combinations thereof.

7. The device of claim 1 wherein the crystal growth layer further comprises a portion which is substantially parallel with respect to a principal plane along which at least a portion of the substrate is oriented.

8. The device of claim 1 wherein the semiconductor light emitting device comprises a light emitting diode structure.

9. The device of claim 1 wherein the semiconductor light emitting device comprises a semiconductor laser structure.

10. The device of claim 1 wherein the surface of the substrate is oriented along a C-plane such that an end portion of the different-in-height portion is oriented perpendicular with respect to at least one of a <1–100> direction and a <11–20> direction and wherein the growth of the crystal growth layer depends on the shape of the difference-in-height portion.

11. The device of claim 1 wherein at least a portion of the crystal growth layer forms a valley having a cross-section that is substantially V-shaped.

12. The device of claim 11, wherein an electrode is formed on the substantially V-shaped valley.

13. A device of claim 1, wherein said crystal growth layer has a plurality of crystal growth layer portions perpendicularly formed within a plane being approximately parallel to a principal plane of the substrate.

14. The device of claim 1, wherein the crystal growth layer comprises a GaN semiconductor.

15. The device of claim 1, wherein the crystal growth layer is grown at a temperature of about 1100° C. or less.

16. The device of claim 1, wherein the crystal growth layer is grown at pressure of about 100 Torr or more.

17. A semiconductor light emitting device comprising:
a substantially planar substrate defining a principal plane, wherein a compound layer composed of a wurtzite compound is formed on the substrate along the principal plane of the substrate wherein the compound layer includes a difference-in-height portion formed in a surface of the substrate layer including a horizontal plane parallel to the principal plane of the substrate and multiple adjacent trenches with horizontal bottoms and vertical sidewalls;
a crystal growth layer formed on the surface of the compound layer wherein at least a portion of the crystal growth layer includes at least one facet structure oriented along an inclined plane that is inclined with respect to the principal plane of the substrate, wherein growth of the facet structure depends on a shape of the difference-in-height portion wherein the crystal growth layer forms a sawtooth configuration;
a first conductive cladding layer, an active layer and a second conductive layer formed on the crystal growth layer in a sequentially stacked arrangement oriented along two or more planes of the crystal growth layer including the inclined plane such that one or more light emission regions are formed; and
one or more electrodes separately formed in the light emission regions.

18. The device of claim 17, wherein the inclined plane comprises at least one of an S-plane and a {11–22} plane.

19. The device of claim 17, wherein the principal plane comprises at least one of a C-plane and a {0001} plane.

20. The device of claim 17, wherein wavelengths of two or more kinds of light emitted from the light emission regions are different from each other.

21. The device of claim 20, wherein at least one of a composition and a thickness of the active layer varies with respect to the light emission regions such that the wavelengths are different from each other.

22. The device of claim 17, wherein the light emitting device has a light emitting diode structure allowing simultaneous emission of light associated with two or more colors.

23. The device of claim 17, wherein the light emitting device has a semiconductor laser structure allowing simultaneous emission of light of two or more colors.

24. The device of claim 17, wherein the substrate layer is oriented along a C-plane such that an end portion of the different-in-height portion is perpendicularly directed with respect to at least one of a <1–100> direction and a <11–20> direction and wherein the growth of the crystal growth layer depends on the shape of the different-in-height portion.

25. The device of claim 17, wherein at least a portion of the crystal growth layer forms a valley having a cross-section that is approximately V-shaped.

26. The device of claim 25, wherein at least one of the electrodes is formed on the approximately V-shaped valley.

27. The device of claim 17, wherein the crystal growth layer comprises a GaN semiconductor.

28. The device of claim 17, wherein the crystal growth layer is grown at a temperature of about 1100° C. or less.

29. The device of claim 17, wherein the crystal growth layer is grown at a pressure of about 100 Torr or more.

* * * * *